(12) United States Patent
Shiba et al.

(10) Patent No.: US 6,180,294 B1
(45) Date of Patent: Jan. 30, 2001

(54) COLOR FILTER HAVING SUBSTRATE AND INK ABSORPTIVE RESIN LAYER

(75) Inventors: Shoji Shiba, Sagamihara; Hiroshi Sato, Yokohama; Katsuhiro Shirota, Inagi; Hideto Yokoi, Yokohama; Akio Kashiwazaki, Yokohama; Keiichi Murai, Yokohama; Takeshi Miyazaki, Ebina, all of (JP)

(73) Assignee: Canon Kabushiki Kaisha, Tokyo (JP)

( * ) Notice: Under 35 U.S.C. 154(b), the term of this patent shall be extended for 0 days.

(21) Appl. No.: 08/965,466

(22) Filed: Nov. 6, 1997

Related U.S. Application Data

(62) Division of application No. 08/695,667, filed on Aug. 8, 1996, now Pat. No. 5,716,740, which is a continuation of application No. 08/345,710, filed on Nov. 22, 1994, now abandoned.

(30) Foreign Application Priority Data

| Nov. 24, 1993 | (JP) | 5-293395 |
| Dec. 21, 1993 | (JP) | 5-322133 |
| Jul. 1, 1994 | (JP) | 6-150870 |
| Jul. 1, 1994 | (JP) | 6-150874 |
| Sep. 14, 1994 | (JP) | 6-220049 |

(51) Int. Cl.[7] ............................ G02B 5/20; G02F 1/1335

(52) U.S. Cl. ......................................... 430/7; 349/106

(58) Field of Search .................... 430/7, 321; 349/106; 347/106

(56) References Cited

U.S. PATENT DOCUMENTS

| 3,649,268 | 3/1972 | Chu et al. ........................... 430/7 |
| 4,313,124 | 1/1982 | Hara ................................. 346/140 R |
| 4,345,262 | 8/1982 | Shirato et al. ..................... 346/140 R |
| 4,418,284 | 11/1983 | Ogawa et al. ....................... 250/578 |
| 4,459,600 | 7/1984 | Sato et al. ........................ 346/140 R |
| 4,463,359 | 7/1984 | Ayata et al. ........................... 346/1.1 |
| 4,558,333 | 12/1985 | Sugitani et al. .................. 346/140 R |
| 4,565,756 | * 1/1986 | Needs et al. ................................ 430/7 |
| 4,608,577 | 8/1986 | Hori ................................. 346/140 R |
| 4,698,113 | 10/1987 | Ogawa ............................... 156/275.7 |
| 4,723,129 | 2/1988 | Endo et al. ........................... 346/1.1 |
| 4,740,796 | 4/1988 | Endo et al. ........................... 346/1.1 |
| 4,808,501 | 2/1989 | Chiulli ..................................... 430/7 |
| 4,818,075 | 4/1989 | Takao et al. . |

(List continued on next page.)

FOREIGN PATENT DOCUMENTS

| 0 400 738 | 5/1990 | (EP) . |
| 0366937 | 5/1990 | (EP) . |
| 0380223 | 8/1990 | (EP) . |

(List continued on next page.)

OTHER PUBLICATIONS

Patent Abstracts of Japan, vol. 17, No. 526 (Sep. 1993) (P–1617).
Patent Abstracts of Japan, vol. 17, No. 703 (Dec. 1993) (P–1666).
Patent Abstracts of Japan, vol. 8, No. 183 (Aug. 1984) (P–296).
Patent Abstracts of Japan, vol. 13, No. 37 (Jan. 1989) (P–819).
Patent Abstracts of Japan, vol. 13, No. 530 (Nov. 1989) (P–966).
Patent Abstracts of Japan, vol. 16, No. 382 (Aug. 1992) (P–1403).
Patent Abstracts of Japan, vol. 16, No. 197 (May 1992) (P–1350).

* cited by examiner

*Primary Examiner*—John A. McPherson
(74) *Attorney, Agent, or Firm*—Fitzpatrick, Cella, Harper & Scinto

(57) ABSTRACT

Provided is a color filter which comprises a substrate and a resin layer on the substrate, the resin layer containing a plurality of colored portions of different colors and non-colored portions.

12 Claims, 6 Drawing Sheets

U.S. PATENT DOCUMENTS

| | | | |
|---|---|---|---|
| 4,846,556 | 7/1989 | Haneda | 350/317 |
| 4,864,324 | 9/1989 | Shirota et al. | 346/1.1 |
| 4,965,612 | 10/1990 | Sakaki et al. | 346/1.1 |
| 4,981,614 | 1/1991 | Miyazaki et al. | 252/587 |
| 4,995,705 | 2/1991 | Yoshinaga et al. | 350/350 |
| 5,002,825 | 3/1991 | Mimura et al. | 428/315.5 |
| 5,011,623 | 4/1991 | Yoshinaga et al. | 252/299.5 |
| 5,039,208 | 8/1991 | Ohnishi et al. | 359/100 |
| 5,079,214 | 1/1992 | Long et al. | 503/227 |
| 5,101,218 | 3/1992 | Sakaki et al. | 346/1.1 |
| 5,190,794 | 3/1993 | Yoshino et al. | 427/162 |
| 5,278,009 | 1/1994 | Iida et al. | 430/7 |
| 5,281,450 | 1/1994 | Yaniv | 427/165 |
| 5,317,434 | 5/1994 | Ohara | 359/68 |
| 5,340,619 | 8/1994 | Chen et al. | 427/165 |
| 5,358,558 | 10/1994 | Yamamoto et al. | 106/22 R |
| 5,391,442 | 2/1995 | Tsushima et al. | 430/7 |
| 5,418,094 | 5/1995 | Sato et al. | 430/7 |
| 5,420,708 | 5/1995 | Yokoyama et al. | 359/67 |
| 5,482,803 | 1/1996 | Ishiwata et al. | 430/20 |
| 5,570,120 | 10/1996 | Sakaki et al. . | |
| 5,593,757 | 1/1997 | Kashiwazaki et al. . | |
| 5,614,007 | 3/1997 | Kurabayashi et al. . | |
| 5,650,251 | 7/1997 | Ishiwata et al. . | |
| 5,681,675 | 10/1997 | Kurauchi et al. | 430/20 |

FOREIGN PATENT DOCUMENTS

| | | |
|---|---|---|
| 0400738 | 12/1990 | (EP) . |
| 0552035 | 7/1993 | (EP) . |
| 54-56847 | 5/1979 | (JP) . |
| 01235903 | 9/1982 | (JP) . |
| 59-075205 | 4/1984 | (JP) . |
| 59-123670 | 7/1984 | (JP) . |
| 59-138461 | 8/1984 | (JP) . |
| 60-71260 | 4/1985 | (JP) . |
| 61-077014 | 4/1986 | (JP) . |
| 61-77014 | 4/1986 | (JP) . |
| 63-294503 | 1/1988 | (JP) . |
| 63-235901 | 9/1988 | (JP) . |
| 63-294503 | 12/1988 | (JP) . |
| 01217320 | 8/1989 | (JP) . |
| 02173703 | 7/1990 | (JP) . |
| 02228605 | 9/1990 | (JP) . |
| 3-10220 | 1/1991 | (JP) . |
| 04317007 | 11/1992 | (JP) . |
| 4-363311 * | 12/1992 | (JP) . |
| 04349401 | 12/1992 | (JP) . |
| 5-080546 * | 4/1993 | (JP) . |
| 05173010 | 7/1993 | (JP) . |
| 5-232310 * | 9/1993 | (JP) . |
| 05288913 | 11/1993 | (JP) . |
| 06228440 | 8/1994 | (JP) . |
| 93 24240 | 12/1993 | (WO) . |

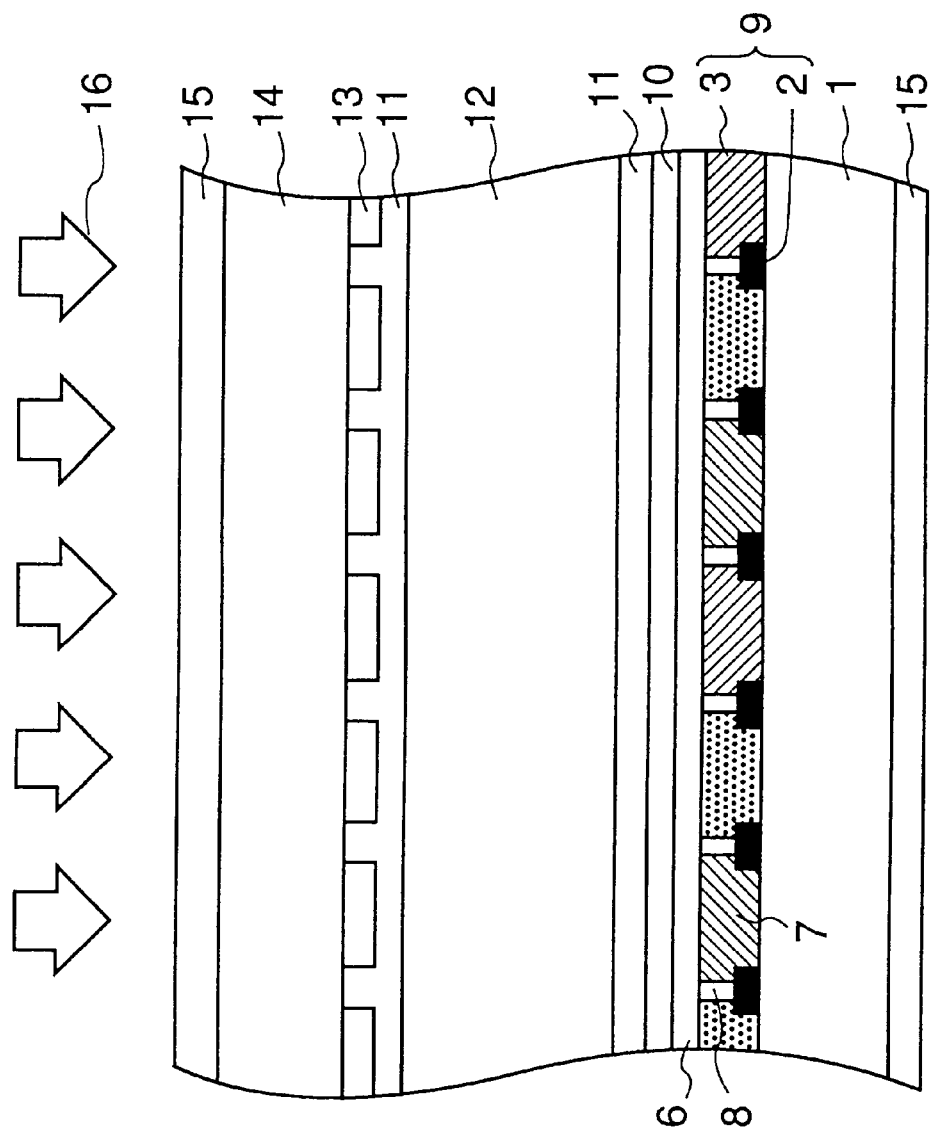

COLOR FILTER HAVING SUBSTRATE AND INK ABSORPTIVE RESIN LAYER

This application is a division of application Ser. No. 08/695,667, filed Aug. 8, 1996 now U.S. Pat. No. 5,716,740, which is a continuation of application Ser. No. 08/345,710, filed Nov. 22, 1994, now abandoned.

BACKGROUND OF THE INVENTION

1. Field of the Invention

The present invention relates to a color filter suitable for a color liquid crystal display which can be used in a color television, a personal computer or the like, a method for manufacturing the color filter, and a liquid crystal panel equipped with the color filter. More specifically, it relates to a color filter for liquid crystal displays manufactured by the utilization of an ink jet recording technique, a method for manufacturing the color filter, and a liquid crystal panel equipped with the color filter.

2. Related Background Art

In recent years, there has been a tendency that the demand of liquid crystal displays, particularly color liquid crystal displays increases with the development of personal computers, particularly portable personal computers. However, for the further spread of the liquid crystal displays, it is necessary to lower their costs, and particularly with regard to the color filter which largely occupies the cost of each display, request for its cost reduction increases. In order to meet the required characteristics of the color filter and to satisfy the above-mentioned demand, various attempts have been heretofore made, but any method which can meet all of the required characteristics has not been established so far. Some methods for manufacturing the color filter will be described below.

A first method which has most often been used is a dyeing method. This dyeing method comprises coating a glass substrate with an aqueous polymer material which is a material to be dyed, patterning the material into a desired shape by a photolithography process, and then immersing the thus obtained pattern in a dyeing bath to obtain a colored pattern. This operation is repeated three times to form the colored layers of Red (R), Green (G) and Blue (B).

Japanese Patent Application Laid-Open No. 5-288913 has described another example of this dyeing method which comprises forming a photosensitive layer, exposing it to light through a pattern, dyeing unexposed portions, and then repeating this process to manufacture a color filter having three colors of R, G and B.

A second method is a pigment dispersion method, which is now being replaced with the above-mentioned dyeing method. This pigment dispersion method comprises first forming, on a substrate, a photosensitive resin layer in which a pigment is dispersed, and then patterning the resin layer to obtain a single-colored pattern. Next, this process is repeated three times to form colored layers having three colors of R, G and B.

A third method is an electrodeposition method. This method comprises first patterning transparent electrodes on a substrate, and then immersing it in an electrodeposition coating solution containing a pigment, a resin, an electrolyte and the like to electrodeposit a first color. This process is repeated three times to form colored layers of R, G and B, and in the last step, these layers are calcined.

A fourth method is a printing method. This method comprises dispersing a pigment in a thermosetting resin, repeating a printing operation three times to coat with the colors of R, G and B, and then thermosetting the colored resin layers to form colored layers. In each of these methods, a protective layer is usually formed on the colored layers.

A point which is common to these methods is that a similar process is required to be repeated three times to give the three colors of R, G and B, which increases the cost. In addition, these methods having many steps lead to deterioration of a yield. Moreover, in the electrodeposition method, the formable patterns are limited, and so it is difficult to apply this method to TFT by an existent technique. The printing method has a drawback that resolution properties and smoothing properties are poor, and so it is not suitable for the formation of a pattern having a fine pitch.

In order to overcome these drawbacks, techniques for manufacturing a color filter by the use of an ink jet system have been developed, and these techniques have been described in Japanese Patent Application Laid-Open Nos. 59-75205, 63-235901 and 1-217320. However, a sufficiently satisfactory method has not been obtained yet.

SUMMARY OF THE INVENTION

Under such circumstances, an object of the present invention is to provide a method for manufacturing a color filter at a law cost in which necessary characteristics such as heat resistance, solvent resistance and resolution properties given by a conventional method are kept up, an ink jet suitability is satisfied, and a process for its manufacture is shortened; a highly reliable color filter manufactured by the above-mentioned method; and a liquid crystal panel equipped with the above-mentioned color filter. In particular, an object of the present invention is to provide a highly precise and reliable color filter for liquid crystals which can prevent color mixing and color skip when ink droplets are ejected by the use of an ink jet system to carry out the arrangement of colorants; and a method for manufacturing the color filter.

The aforesaid objects can be achieved by the present invention, as follows.

A first aspect of the present invention is directed to a color filter which comprises a substrate and a resin layer on the substrate, the resin layer containing a plurality of colored portions of different colors and non-colored portions.

A second aspect of the present invention is directed to a color filter which comprises a substrate having shade portions and light-transmittable portions and a resin layer on the substrate, the resin layer on the shade portions containing colored portions and non-colored portions.

A third aspect of the present invention is directed to a method for manufacturing a color filter which comprises arranging colorants on a substrate by an ink jet system, said method being characterized by comprising:

(1) a step of forming, on a substrate, a resin layer which can cure by light irradiation or the combination of the light irradiation and heating to reduce ink-acceptable properties of the layer, (2) a step of curing portions of the resin layer by the light irradiation or the combination of the light irradiation and the heating, (3) a step of providing with the colorants to uncured portions of the resin layer by an ink jet system, and (4) a step of curing the colored portions of the resin layer by the light irradiation and/or the heating.

A fourth aspect of the present invention is directed to a liquid crystal panel which comprises a color filter described above, a substrate facing to the color filter, and a liquid crystal compound enclosed between both the substrates.

A fifth aspect of the present invention is directed to a liquid crystal panel which comprises a color filter described above, a substrate having shape portions arranged at a position opposite to the color filter, and a liquid crystal composition enclosed between the color filter and the substrate.

A sixth aspect of the present invention is directed to a method for manufacturing a color filter which comprises arranging colorants on a substrate by an ink jet system, said method being characterized by comprising:

(1) a step of forming, on a substrate, a resin composition layer which has an ink-acceptable property and in which the residue of a hydrophilic group in light irradiation portions decreases by light irradiation or the combination of the light irradiation and heating, (2) a step of subjecting portions of the resin layer to the light irradiation or the combination of the light irradiation and the heating, (3) a step of providing with the colorants to unirradiated portions of the resin composition layer by an ink jet system, and (4) a step of curing the colored portions of the resin composition layer by the light irradiation and/or the heating.

A seventh aspect of the present invention is directed to a color filter which comprises a substrate having light-transmittable portions and a resin layer having the colored light-transmittable portions on the substrate, said resin layer being characterized by comprising at least (a) a homopolymer of a monomer comprising a structure unit represented by the following formula (I) and/or a copolymer of the above-mentioned monomer and another vinyl monomer, and (b) a compound selected from the group consisting of halogenated triazine compounds, diphenyliodonium salt derivatives and triphenylsulfonium salt derivatives:

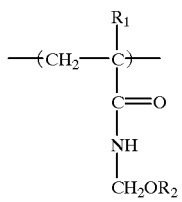

(I)

wherein $R_1$ is hydrogen or a methyl group; and $R_2$ is a hydrogen atom or an alkyl group having 1 to 5 carbon atoms.

An eighth aspect of the present invention is directed to a method for manufacturing a color filter which comprises arranging colorants on a substrate having shade portions by an ink jet system, said method comprising:

(1) a step of forming, on the substrate, a layer comprising a composition which has ink absorbency and in which the ink absorbency deteriorates in the portions of the composition treated by light irradiation or the combination of the light irradiation and a heat treatment, (2) a step of subjecting the portions of the composition layer on the substrate to the light irradiation or the combination of the light irradiation and the heat treatment to deteriorate the ink absorbency of the irradiated portions, (3) a step of ejecting ink droplets by the use of an ink jet system to color the untreated portions of the composition layer, and (4) a step of subjecting the composition layer to the light irradiation and/or the heat treatment to cure the composition layer, said resin layer being characterized by comprising at least (a) a homopolymer of a monomer comprising a structure unit represented by the following formula (I) and/or a copolymer of the above-mentioned monomer and another vinyl monomer, and (b) a compound selected from the group consisting of halogenated triazine compounds, diphenyliodonium salt derivatives and triphenylsulfonium salt derivatives:

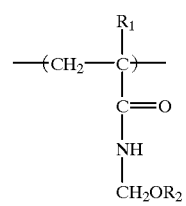

(I)

wherein $R_1$ is hydrogen or a methyl group; and $R_2$ is a hydrogen atom or an alkyl group having 1 to 5 carbon atoms.

A ninth aspect of the present invention is directed to a liquid crystal panel which comprises a color filter described in eighth aspect, a substrate arranged at a position opposite to the color filter, and a liquid crystal composition enclosed between the color filter and the substrate.

A tenth aspect of the present invention is directed to a method for manufacturing a color filter which comprises arranging colorants on a substrate having light-transmittable portions by an ink jet system, said method being characterized by comprising:

(1) a step of forming, on the substrate, a resin layer which can be rendered ink-acceptable by light irradiation or the combination of the light irradiation and heating, (2) a step of rendering the resin layer on the substrate ink-acceptable by the light irradiation or the combination of the light irradiation and the heating, (3) a step of providing with the colorants to the ink-acceptable portions of the resin layer by the ink jet system, and (4) a step of curing the colored portions of the resin layer by the light irradiation or the combination of the light irradiation and the heating.

An eleventh aspect of the present invention is directed to a color filter manufactured by the method described in tenth aspect.

A twelfth aspect of the present invention is directed to color filter which comprises a substrate and a resin layer having colored light-transmittable portions on the substrate, said resin layer being characterized by comprising at least (a) an acrylic resin having a structure unit represented by the following formula (V) and (b) a compound selected from the group consisting of halogenated triazine compounds, diphenyliodonium salt derivatives and triphenylsulfonium salt derivatives:

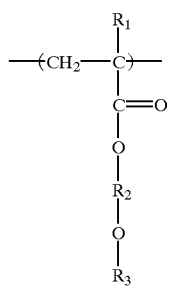

(V)

wherein $R_1$ is hydrogen or an alkyl group having 1 to 5 carbon atoms; $R_2$ is an alkylene group having 1 to 5 carbon atoms or a phenylene group; $R_3$ is an alkyl group having 1 to 5 carbon atoms, an alkyl-substituted silyl group, a phenyl group or a substituted aromatic group.

A thirteenth aspect of the present invention is directed to a method for manufacturing a color filter which comprises arranging colorants on a substrate by an ink jet system, said method comprising:

(1) a step of forming, on a substrate, a layer comprising a composition in which ink absorbency can be improved in the treated portions of the layer by light irradiation or the combination of the light irradiation and a heat treatment, (2) a step of improving the ink absorbency of the portions of the composition layer by the light irradiation or the combination of the light irradiation and the heat treatment, and (3) a step of ejecting ink droplets by the use of an ink jet system to color the treated portions of the composition layer, said resin layer being characterized by comprising at least (a) an acrylic resin having a structure unit represented by the following formula (V) and (b) a compound selected from the group consisting of halogenated triazine compounds, diphenyliodonium salt derivatives and triphenylsulfonium salt derivatives:

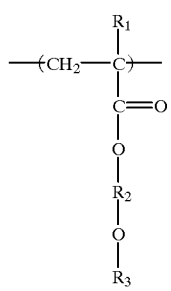

(V)

wherein $R_1$ is hydrogen or an alkyl group having 1 to 5 carbon atoms; $R_2$ is an alkylene group having 1 to 5 carbon atoms or a phenylene group; $R_3$ is an alkyl group having 1 to 5 carbon atoms, an alkyl-substituted silyl group, a phenyl group or a substituted aromatic group.

A fourteenth aspect of the present invention is directed to a color filter manufactured by a manufacturing method described in thirteenth aspect.

A fifteenth aspect of the present invention is directed to a liquid crystal panel which comprises a color filter described in twelfth aspect, a substrate arranged at a position facing to the color filter, and a liquid crystal composition sealed between the color filter and the substrate.

BRIEF DESCRIPTION OF THE DRAWINGS

FIG. 3 shows a sectional view of a liquid crystal panel of the present invention.

DETAILED DESCRIPTION OF THE PREFERRED EMBODIMENTS

The present invention will be described in more detail with reference to drawings.

FIGS. 1A to 1E show a flow sheet of a manufacturing process of a color filter in the present invention, and in this drawing, one example of the constitution of the color filter of the present invention is shown.

In the present invention, as a substrate, a light-transmittable substrate is preferable, and a glass substrate is usually used. However, the glass substrate is not restrictive, and any material can be used as the substrate, so long as it has necessary characteristics such as transparency and mechanical strength which the color filter for liquid crystals should have.

Figure 1A:
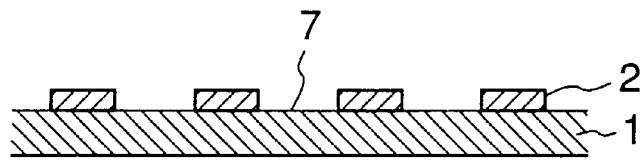
FIGS. 1A to 1F show a flow sheet of a manufacturing process of a color filter for liquid crystals according to the present invention.
Figure 1B:
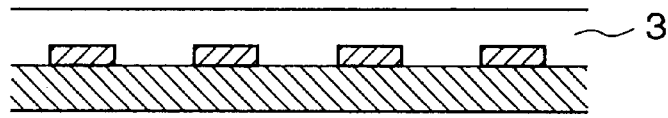

FIG. 1A shows a glass substrate 1 having light-transmittable portions 7 and black matrices 2 which are shade portions. In the first place, the substrate 1 provided with the black matrices 2 is coated with a resin composition which can cure by light irradiation or the light irradiation and heating to reduce an ink-acceptable property of the layer, and if necessary, prebaking is then carried out to form a resin layer 3 (FIG. 1B). In forming the resin layer 3, spin coating, roll coating, bar coating, spray coating or dip coating can be used, and this coating means is not particularly restrictive.

Figure 1C:
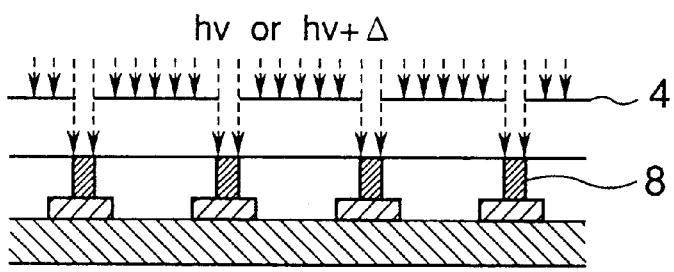
Figure 1D:
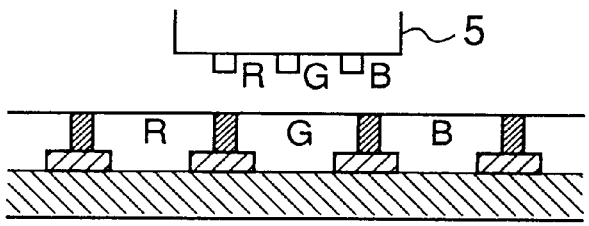
Figure 1E:
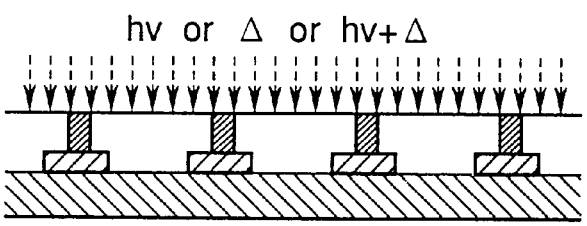

Next, portions of the resin layer which are shaded by the black matrices 2 are first pattern-exposed through a photomask 4 to cure these portions of the resin layers, thereby forming sites 8 (non-colored portions) which do not absorb an ink (FIG. 1C). Thereafter, the same layer is colored in colors of R, G and B by the use of an ink jet head 5 (FIG. 1D), and if necessary, the ink is then dried.

The photomask 4 which can be used at the time of the pattern exposure has holes which permit the portions of the resin layer shaded by the black matrices to cure. In order to prevent the color skip of the colorant in the portions of the resin layer which are in contact with the black matrices, a relatively large amount of the ink is required to be ejected from ink jet head. For this purpose, it is preferable to use the mask having the holes whose diameter is smaller than the shade width of each black matrix.

As the ink for the coloring, a dyestuff-type and a pigment-type ink are both usable, and both liquid inks and solid inks are also usable.

As the curable resin composition which can be used in the present invention, any one is acceptable, so long as it has an ink-receptable property and can cure by at least one treatment of light irradiation or the combination of the light irradiation and heating. Examples of the resin include acrylic resins, epoxy resins, silicon resins, cellulose derivatives such as hydroxypropyl cellulose, hydroxyethyl cellulose, methyl cellulose and carboxymethyl cellulose, and modified resins thereof.

For the purpose of causing the resin to bring about a crosslinking reaction by light or light and heat, a photoinitiator (a crosslinking agent) can be used. Examples of the usable photoinitiator include dichromates, bisazido compounds, radical initiators, cationic initiators and anionic initiators. These photoinitiators can be used in combination, or they can be used with another sensitizer, when used. Moreover, in order to accelerate the crosslinking reaction, a heat treatment may be carried out after the light irradiation.

The resin layer containing these components is very excellent in fastnesses to heat, water and the like, and it can sufficiently withstand a high temperature and washing in subsequent steps.

As an ink jet system which can be used in the present invention, there can be used a bubble jet type using an electricity-heat converter as an energy-generating element and a piezo jet type using a piezo-electric element. A colored area and a colored pattern can be optionally set.

In the present embodiment, the black matrices are formed on the substrate, but they can be formed on the resin layer after the formation of the curable resin composition layer or the coloring without any particular problem. Therefore, the constitution of the black matrices in this embodiment is not restrictive. The black matrices can be preferably prepared by forming a metallic thin film on the substrate by sputtering or vapor deposition, and then patterning the film by photolithography, or alternatively patterning a photosensitive black resin. These procedures are not restrictive.

Figure 1F:
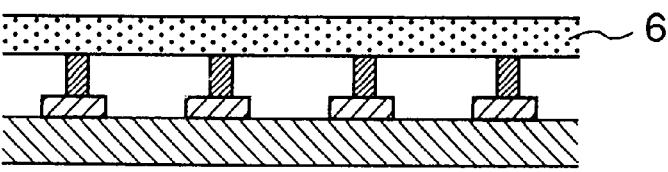

Next, the light irradiation and/or the heat treatment is carried out to cure the curable resin composition (FIG. 1E), and if necessary, a protective layer 6 is formed (FIG. 1F). The protective layer 6 is made of a second resin composition of a photosetting type, a thermosetting type or a photo-thermosetting type, or an inorganic material with the aid of vapor deposition or sputtering. Thus, as the protective layer 6, any material can be used, so long as it does not impede the transparency of the obtained color filter, and can sufficiently withstand subsequent steps such as an ITO formation step and an orientation film formation step.

FIGS. 2A to 2E show a manufacturing process of the color filter for use in a liquid crystal panel in which the black matrices are provided on the opposite substrate.

The method in which the black matrices are provided on the opposite substrate instead of the side of the color filter is effective as a technique of improving an aperture ratio.

Figure 2A:
FIGS. 2A to 2F show a flow sheet of a manufacturing process of another color filter of the present invention.
Figure 2B:
Figure 2C:
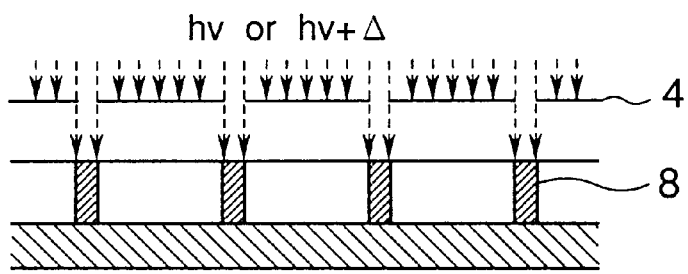
Figure 2D:
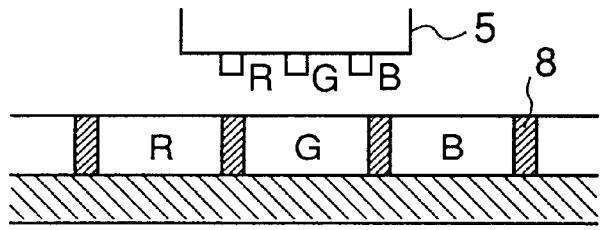
Figure 2E:
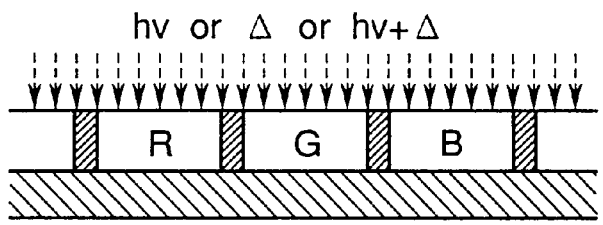

A glass substrate 1 shown in FIG. 2A is coated with a composition in which the ink absorbency of light irradiation portions deteriorates by the light irradiation or the combination of the light irradiation and the heat treatment, and if necessary, prebaking is then done to form a composition layer 3 in which the ink absorbency of the light irradiation portions deteriorates by the light irradiation or the combination of the light irradiation and the heat treatment (FIG. 2B).

Next, pattern exposure is carried out through a photomask 4 to reduce the ink absorbency of the exposed portions of the composition layer 3 (FIG. 2C), and then non-exposed portions of the same layer are colored in the colors of R, G and B by the use of an ink jet head 5 (FIG. 2D), followed by drying, if necessary. In order to prevent color skip, it is important that the width of non-colored portions 8 is smaller than that of the black matrices (not shown) provided on the faced substrate.

Figure 2F:
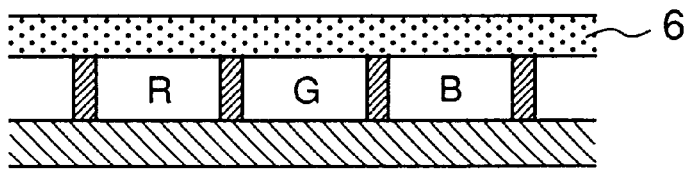

Afterward, the colored resin composition layer is cured by the light irradiation and/or the heat treatment (FIG. 2E), and if necessary, a protective layer 6 is formed (FIG. 2F) to obtain a color filter. As the protective layer, there can be used a resin composition of a photosetting type, a thermosetting type or a photo-thermosetting type, or an inorganic material formed by vapor deposition or sputtering. Thus, as the protective layer 6, any material can be used, so long as it does not impede the transparency of the obtained color filter, and can sufficiently withstand subsequent steps such as an ITO formation step and an oriented film formation step.

In consequence, the color filter is manufactured which has the resin layer, the plurality of colored portions having the different colors, and the non-colored portions on the substrate.

Figure 4:
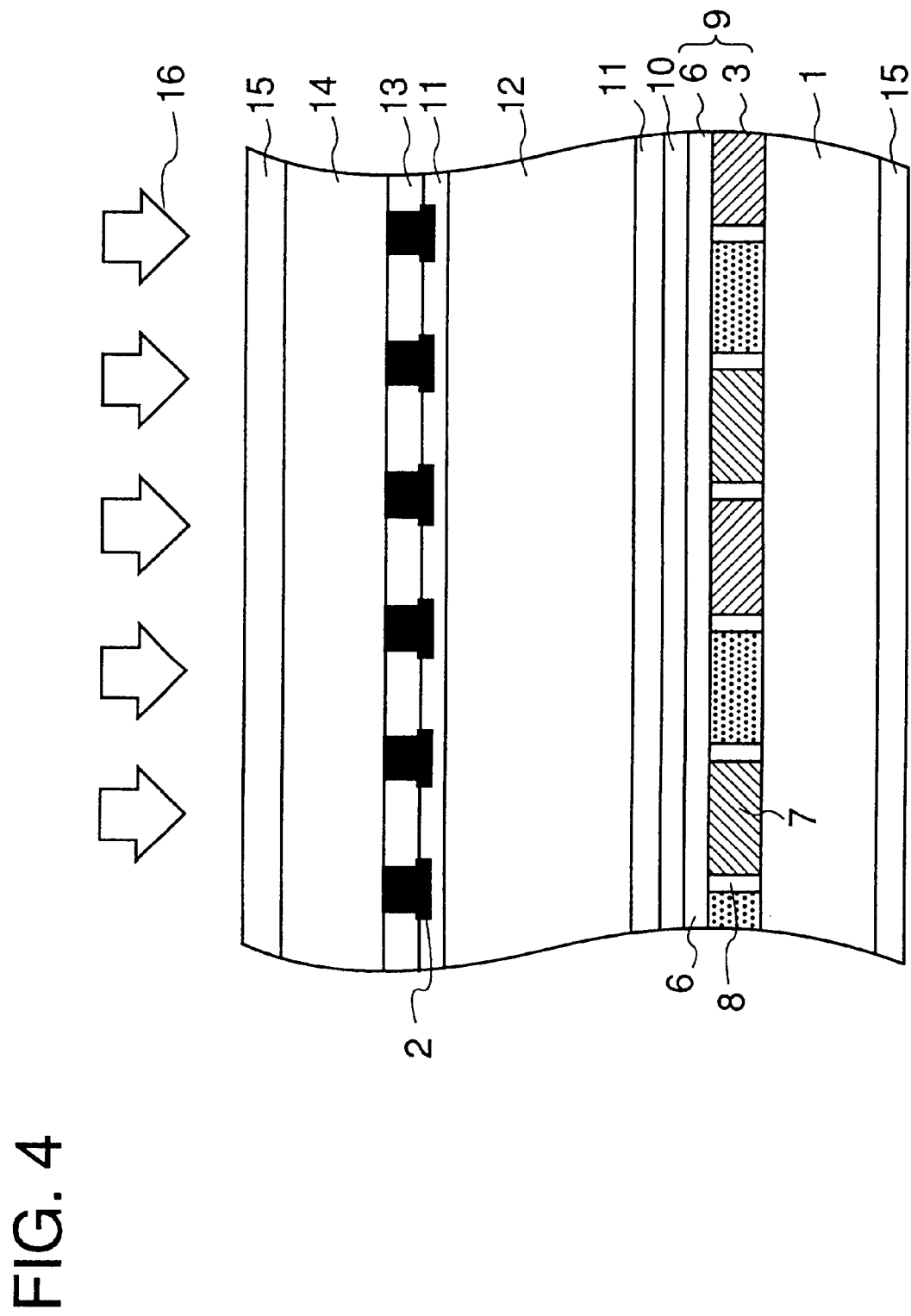
FIG. 4 shows a sectional view of another liquid crystal panel of the present invention.

FIGS. 3 and 4 show sectional views of TFT color liquid crystal panels incorporated with the color filter of the present invention. These embodiments are not restrictive.

The color liquid crystal panel can usually be formed by combining a color filter substrate 1 with a glass substrate 14, and then enclosing a liquid crystal compound 12 therebetween. On the inside of the one substrate 14 of the liquid crystal panel, TFT (not shown) and transparent pixel electrodes 13 are formed in the state of matrices. On the inside of the glass substrate 1, a color filter 9 is arranged so that the color materials of R, G and B are placed at a position opposite to the pixel electrodes, and all over the color filter 9, a transparent common electrode 10 is formed. Black matrices are formed on the side of the color filter substrate (FIG. 3), but in the case of a BM on-array type liquid crystal panel, they are formed on the faced TFT substrate side (FIG. 4). Moreover, on the surfaces of both the substrates, orientation films 11 are formed and then subjected to a rubbing treatment to arrange liquid crystal molecules in a certain direction. Furthermore, polarizing plates 15 adhere to the outsides of the respective glass substrates 1 and 14, and the liquid crystal compound 12 is filled into the space (about 2 to 5 μm) between these glass substrates. As a back light 16, a combination of fluorescent lamps (not shown) and a scattering plate (not shown) is usually used, and display is carried out by utilizing the liquid crystal compound as a light shutter for changing the transmittance of the back light. Reference numeral 2 is a black matrix, 3 is an ink receiving layer, 6 is a protective layer, 7 is a colored portion, and 8 is a non-colored portion.

According to another method for manufacturing the color filter of the present invention, a substrate on which black matrices are formed is coated with a resin composition layer which has ink-acceptable property and in which the residue of a hydrophilic group in light irradiation portions decreases by light irradiation or the combination of the light irradiation and heating, thereby forming the resin composition layer which has the ink-acceptable properties and in which the residue of the hydrophilic group in the light irradiation portions decreases by the light irradiation or the combination of the light irradiation and the heating. This method intends to prevent the mixing of the inks and the excessive diffusion of the ink by the utilization of a difference of ink absorbency between exposed portions and unexposed portions. In this method, it is preferable to use the resin composition in which the ink absorbency of the light irradiation portions deteriorate by the light irradiation or the combination of the light irradiation and the heating, and in other words, it is preferable to use the resin composition which can give rise to crosslinking via a hydrophilic group such as an hydroxyl group, an alkoxy group or an amino group, or which brings about an additional reaction with the hydrophilic group. In the present embodiment, the absorbency deteriorate only by the light irradiation, but the heat treatment may be used together with the light irradiation to accelerate a crosslinking reaction without any problem.

As a typical example of the resin composition which can be used in the present invention, a system utilizing the crosslinking reaction by chemical amplification is preferable. Examples of the basic resin include cellulose derivatives such as hydroxypropyl cellulose and hydroxyethyl cellulose, a high-molecular alcohol such as polyvinyl alcohol and its derivatives, a novolak resin such as cresol-novolak and its derivatives, and an acrylic resin containing an acrylic monomer having a hydroxyl group such as hydroxyethyl methacrylate. An example of the crosslinking agent includes a melamine derivative such as methylol melamine, and examples of the photoinitiator include an onium salt such as triphenylsulfonium hexafluoroantimonate and a halogenated organic compound such as trichloromethyltriazine. These examples are not restrictive.

The particularly preferable resin composition which can be used in the present invention comprises at least (a) a homopolymer of a monomer comprising a structure unit represented by the following formula (I) and/or a copolymer of the above-mentioned monomer and another vinyl monomer, and (b) a compound selected from the group consisting of halogenated triazine compounds, diphenyliodonium salt derivatives and triphenylsulfonium salt derivatives:

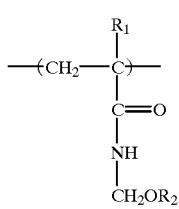

(I)

wherein $R_1$ is hydrogen or a methyl group; and $R_2$ is a hydrogen atom or an alkyl group having 1 to 5 carbon atoms.

Examples of the monomer comprising the structure unit represented by the above formula (I) which is the component (a) include N-methylolacrylamide, N-methoxymethylacrylamide, N-ethoxymethylacrylamide, N-isopropoxymethylacrylamide, N-methylolmethacrylamide, N-methoxymethylmethacrylamide and N-ethoxymethylacrylamide, but they are not restrictive. Each of these monomers is used singly or may be copolymerized with another vinyl monomer. Examples of the other vinyl monomer include acrylic acid, methacrylic acid; acrylic acid esters such as methyl acrylate and ethyl acrylate; methacylic acid esters such as methyl methacrylate and ethyl methacrylate; vinyl monomers having a hydroxyl group such as hydroxymethyl methacrylate, hydroxyethyl methacrylate, hydroxymethyl acrylate and hydroxyethyl acrylate; styrene, α-methylstyrene, acrylamide, methacrylamide, acrylonitrile, allylamine, vinylamine, vinyl acetate and vinyl propionate. Needless to say, they are not restrictive.

Examples of the halogenated triazine compounds include compounds represented by the formula (II)

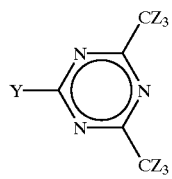

(II)

wherein Z is a halogen atom; Y is $CZ_3$ (Z is a halogen atom), phenyl, a halogenated phenyl,

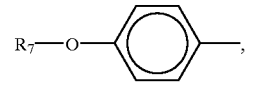

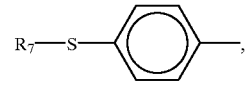

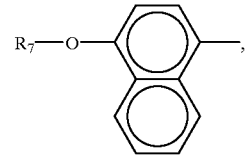

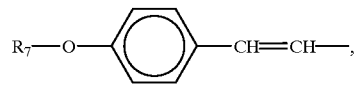

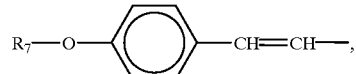

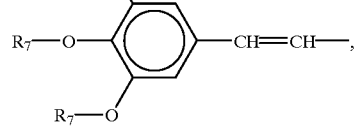

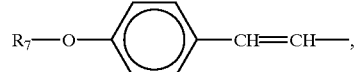

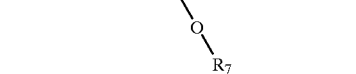

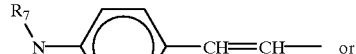

wherein $R_7$ is an alkyl group having 1 to 5 carbon atoms, and when one group has two $R_7$s, they may be different from each other.

The preferable examples of the halogenated triazine compounds function as a photoinitiator, and they are preferably compounds in which a trichloromethyl group is introduced into a triazine ring, as in the compounds represented by the above-mentioned formula (II). Typical examples of the halogenated triazine compounds include 2-(p-methoxyphenyl)-4,6-bis(trichloromethyl)-s-triazine, 2-styryl-4,6-bis(trichloromethyl)-s-triazine, 2-(p-methylstyryl)-4,6-bis(trichloromethyl)-s-triazine and 2-phenyl-4,6-bis(trichloromethyl)-s-triazine.

The diphenyliodonium salt derivatives include compounds represented by the formula (III)

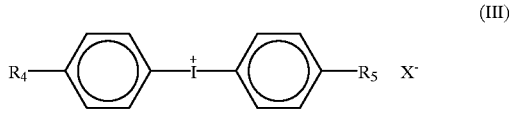

(III)

wherein $R_4$ and $R_5$ are each hydrogen, an alkoxy group having 1 to 5 carbon atoms or t-butyl group; and $X^-$ is $BF_4^-$, $PF_6^-$, $SbF_6^-$ or $CF_3SO_3^-$.

The preferable examples of the diphenyliodonium salt derivatives function as a photoinitiator, and typical examples thereof include diphenyliodonium hexafluoroantimonate, diphenyliodonium tetrafluoroborate, diphenyliodonium hexafluorophosphate, diphenyliodonium triflate and their derivatives. Needless to say, they are not restrictive.

The triphenylsulfonium salt derivatives include compounds represented by the formula (IV)

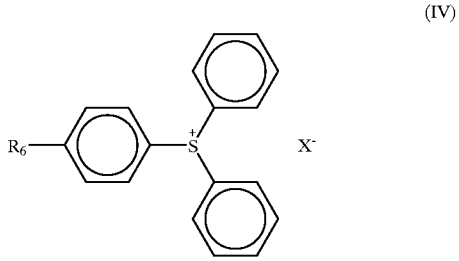

(IV)

wherein $R_6$ is hydrogen, an alkyl group or an alkoxy group each having 1 to 5 carbon atoms,

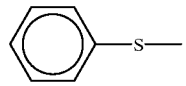

or fluorine; and $X^-$ is as defined above.

The preferable examples of the triphenylsulfonium salt derivatives function as a photoinitiator, and typical examples thereof include triphenylsulfonium hexafluoroantimonate, triphenylsulfonium tetrafluoroborate, triphenylsulfonium hexafluorophosate, triphenylsulfonium triflate and their derivatives. Needless to say, they are not restrictive.

With regard to a ratio between the compounds (a) and (b), the amount of the compound (b) is in the range of from 0.01 to 10 parts by weight, preferably from 0.01 to 5 parts by weight with respect to 100 parts by weight of the polymer which is the compound (a).

The molecular weight of the above-mentioned polymer is preferably in the range of from $10^2$ to $10^7$. The employment of this kind of resin causes a definite difference of ink absorbency between an irradiated portion and a non-irradiated portion to permit the prevention of the color mixing of inks.

A coating material of portions shaded with the black matrices is first subjected to pattern exposure (FIG. 1D), and the coloring of R, G and B is then made by the use of an ink jet head 5 (FIG. 1C). Afterward, if necessary, inks are dried. In the exposed portions, the residue of a hydrophilic group such as an hydroxyl group, an alkoxy group or an amino group decreases with the progress of the reaction, so that the exposed portions scarcely absorb the ink, whereby the mixture of the inks having the colors can be prevented. In order to cause a difference of ink absorbency, the residue of the hydrophilic group in the exposed portions is preferably decreased to 70% or less of the amount of the hydrophilic group in the unexposed portions. In this case, as a quantitative analysis technique of the hydrophilic group, a spectrum analysis using IR, NMR or the like is effective. The photomask which can be used at the time of the pattern exposure has openings for exposing the portions shaded by the black matrices. In this case, in view of the fact that a large amount of the ink is required to be ejected for the prevention of color skip in the portions which are in contact with the black matrices, it is preferable to use the mask provided with the openings having a diameter smaller than the width of the portions shaded by the black matrices.

Next, light irradiation, a heat treatment or a combination of the light irradiation and the heat treatment is carried out to cure the colored coating material (FIG. 1E), and if necessary, a protective layer is then formed (FIG. 1F). As the protective layer, there can be used a resin material of a photosetting type, a thermosetting type or a photo-thermosetting type, or an inorganic film formed by vapor deposition or sputtering. Thus, as the protective layer, any material can be used, so long as it does not impede the transparency of the obtained color filter, and can sufficiently withstand subsequent steps such as an ITO formation step and an oriented film formation step.

The above-mentioned constitution has been described in accordance with FIG. 1, but needless to say, the constitution can also be applied to a method for manufacturing a color filter shown in FIG. 2.

The procedure for curing the resin layer with light or light and heat has been described above, but next, a procedure for rendering the resin layer ink-acceptable with light or light and heat will be described.

Figure 5A:
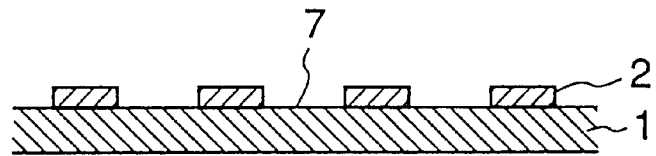
FIGS. 5A to 5E show a flow sheet of a manufacturing process of another color filter of the present invention.
Figure 5B:
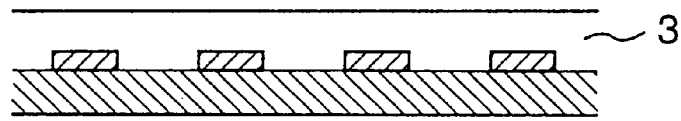

FIG. 5A shows a glass substrate having black matrices thereon which are shade portions 2. In the first place, the substrate provided with the black matrices is coated with a composition, in which the ink absorbency of light irradiated portions can be improved by light irradiation or the combination of the light irradiation and a heat treatment, and if necessary, prebaking is then carried out to form a resin layer 3 (FIG. 5B).

In forming this composition layer, a coating method such as spin coating, roll coating, bar coating, spray coating or dip coating can be used, and this coating means is not particularly restrictive. In this case, a compound such as perylene, anthracene or phenothiazine may be added as a sensitizing agent to the composition layer.

Figure 5C:
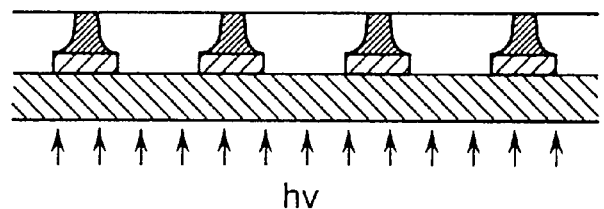
Figure 5D:
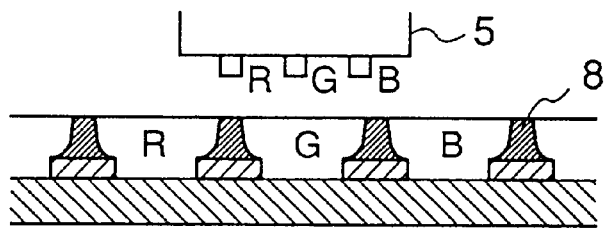

Next, light irradiation is carried out from the underside of the substrate, and at this time, the composition layer is pattern-exposed through the black matrices as a mask to improve the ink absorbency of the irradiated portions of the composition layer (FIG. 5C). Thereafter, openings which are the irradiated portions are colored with colors of R, G and B by the use of an ink jet head 5 (FIG. 5D), and if necessary, the inks are then dried.

In order to prevent the color skip of the color filter, the portions of the composition layer having a larger area than the openings of the black matrices are preferably colored, and for this coloring, it is necessary that the portions of the composition layer having a larger area than the black matrices as the mask take part in reaction. For the purpose of causing the reaction, some means are effective, and for example, diffused light can be used as irradiation light at the time of exposure, a large excess of energy can be irradiated, or a heat treatment is carried out for a long period of time after the exposure to diffuse the reaction. In this embodiment, there has been described the example where the pattern exposure is carried out by the use of the black matrices as the mask, but the pattern exposure may be done from the upside of the resin composition layer by the use of another photomask.

FIGS. 6A to 6E show a method for preparing a color filter for use in a liquid crystal panel in which the black matrices are formed on an opposite substrate.

The method in which the black matrices are provided on the faced substrates instead of the side of the color filter is effective as a technique of improving an opening ratio.

Figure 6A:
FIGS. 6A to 6E show a flow sheet of a manufacturing process of still another color filter of the present invention.
Figure 6B:
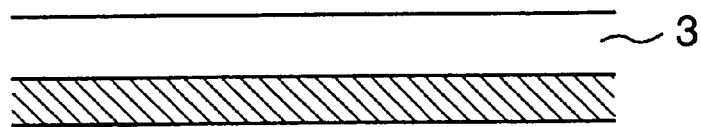
Figure 6C:
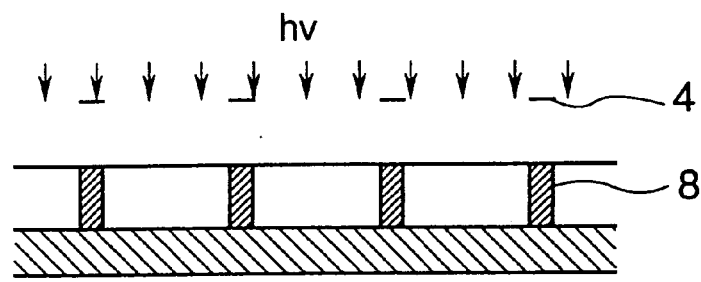
Figure 6D:
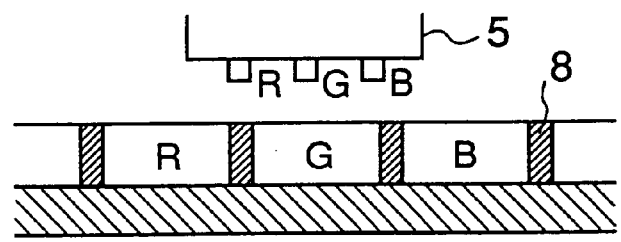
Figure 6E:
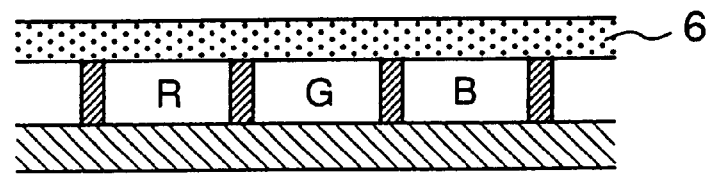

A glass substrate 1 shown in FIG. 6A is coated with a composition in which the ink absorbency of light irradiation portions can be improved by the light irradiation or the combination of the light irradiation and the heat treatment, and if necessary, prebaking is then done to form a composition layer 3 (FIG. 6B).

Next, the pattern exposure is carried out through a photomask 4 to improve the ink absorbency of the exposed portions of the composition layer 3 (FIG. 6C), and these exposed portions of the layer are colored in the colors of R, G and B by the use of an ink jet head 5 (FIG. 6D), followed by drying, if necessary. In order to prevent the color skip, it is important that the width of non-colored portions 8 is smaller than that of the black matrices (not shown) provided on the opposite substrate.

The resin composition for use in the present invention which can be rendered ink-acceptable is poor in ink-acceptable properties in itself, but it can be rendered ink-acceptable by at least one of the light irradiation or the combination of the light irradiation and the heat treatment under certain conditions. Any resin can be used, so long as it can cure under certain conditions, and examples of the resin include a novolak resin such as cresol-novolak, polyparahydroxystyrene and its derivatives in which a hydroxy group is blocked with a trimethylsilyl group, cellulose derivatives such as hydroxypropyl cellulose, hydroxyethyl cellulose, methyl cellulose and carboxymethyl cellulose in which a hydroxyl group is esterified or blocked with an acetyl group, and the like.

Suitably usable examples of the photoinitiator which can accelerate a reaction with the aid of light or the combination of light and heat include an onium salt such as triphenylsulfonium hexafluoroantimonate, a halogenated organic compound such as trichloromethyltriazine, naphthoquinonediazide and their derivatives.

The particularly preferable resin composition which can be used in the present invention comprises at least (a) an acrylic resin having a structure unit represented by the following formula (V) and (b) a compound as the photoinitiator selected from the group consisting of halogenated triazine compounds, diphenyliodonium salt derivatives and triphenylsulfonium salt derivatives:

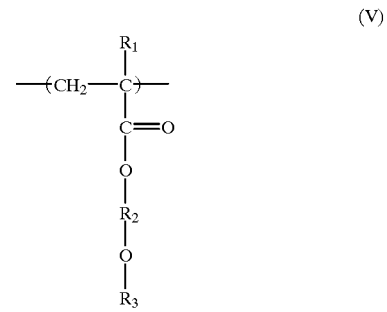

wherein $R_1$ is hydrogen or an alkyl group having 1 to 5 carbon atoms; $R_2$ is an alkylene group having 1 to 5 carbon atoms or a phenylene group; $R_3$ is an alkyl group having 1 to 5 carbon atoms, an alkyl-substituted silyl group, a phenyl group or a substituted aromatic group.

The acrylic resin (a) having a structure unit represented by the above-mentioned formula (V) preferably gives rise to the hydrolysis of an ether linkage by cations formed from the photoinitiator by light irradiation to produce a hydroxyl group. Typical examples of the acrylic resin are as follows:

Exemplary Moiety 1

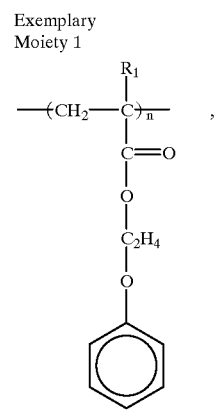

Exemplarly Moiety 2

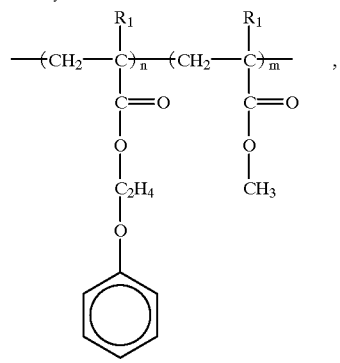

Exemplarly Moiety 3

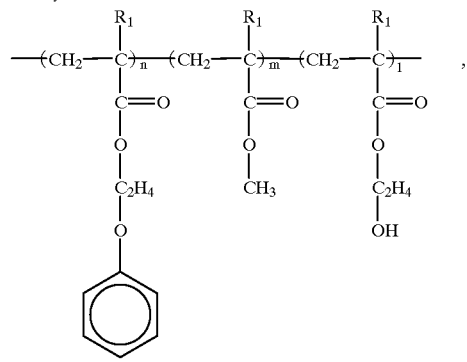

Exemplarly Moiety 4

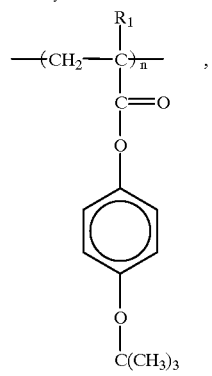

Exemplarly Moiety 5

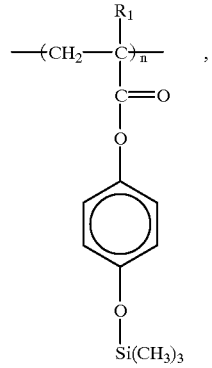

Exemplarly Moiety 6

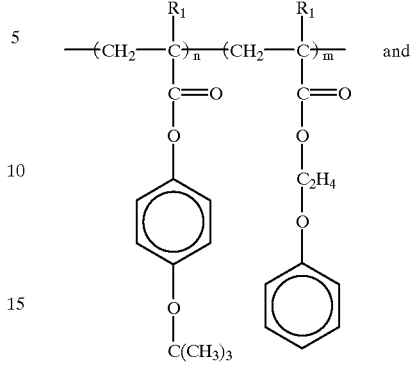

and

Exemplarly Moiety 7

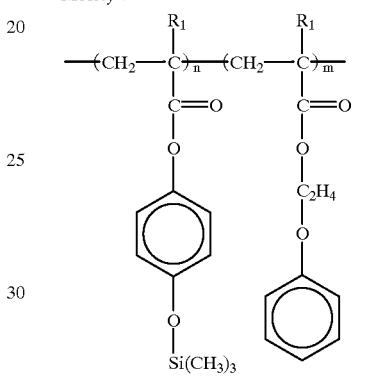

.

The molecular weight of these resins is preferably in the range of from $10^2$ to $10^7$. The employment of this kind of resin causes a definite difference of ink absorbency between an irradiated portion and a non-irradiated portion to permit the prevention of the color mixing of inks.

Usable examples of the halogenated triazine compounds, the diphenyliodonium salt derivatives and the triphenylsulfonium salt derivatives with respect to compound (b) are as defined above.

With regard to a ratio between the compounds (a) and (b), the amount of the compound (b) is in the range of from 0.01 to 10 parts by weight, preferably from 0.01 to 5 parts by weight with respect to 100 parts by weight of the acrylic resin which is the compound (a).

In the exposed portions of the resin layer comprising these components, the amount of a hydroxyl group increases with the progress of the reaction, so that these portions become easy to absorb inks. Thus, when the resin layer is colored, the color mixing of the inks can be prevented.

In order to improve the ink absorbency of the resin, the conversion of the resin into the hydrophilic group is preferably 30% or more. As the technique of a quantitative analysis of this hydrophilic group, a spectral analysis utilizing IR, NMR or the like is effective.

The resin layer comprising these components is very excellent in fastnesses to heat, water and the like, and it can sufficiently withstand a high temperature and washing in subsequent steps.

Figure 5E:
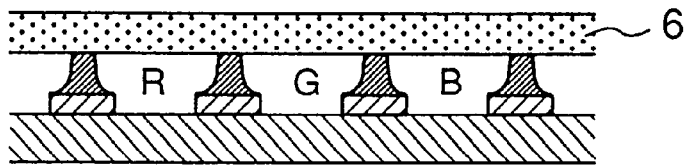

Next, if necessary, a protective layer 6 is formed (FIGS. 5E and 6E) to obtain a color filter. As the protective layer, there can be used a resin material of a photosetting type, a thermosetting type or a photo-thermosetting type, or an inorganic film formed by vapor deposition or sputtering.

Thus, as the protective layer, any material can be used, so long as it does not impede the transparency of the obtained color filter, and can sufficiently withstand subsequent steps such as an ITO formation step and an oriented film formation step.

Next, the present invention will be described in more detail with reference to examples, but the scope of the present invention should not be limited to these examples. The designation of "%" means "% by weight" unless otherwise noted.

EXAMPLE 1

As shown in FIG. 1A, a glass substrate 1 provided with black matrices 2 was spin-coated with a water-soluble negative-type resist comprising polyvinylpyrrolidone and a bisazido compound (photoinitiator) so that the thickness of a film might be 2 μm, and prebaking was then carried out at 90° C. for 20 minutes to form a photocurable resin layer 3.

Next, portions of the resin layer on the black matrices were pattern-exposed through a photomask provided with openings having a diameter smaller than the width of the black matrices, thereby curing them.

In addition, a matrix pattern of R, G and B was colored with dye inks by the use of an ink jet head 5, and the inks were dried at 90° C. for 5 minutes. In succession, overall exposure was carried out to cure the resin layer 3.

EXAMPLE 2

A resin layer 3 colored as in Example 1 was spin-coated with a photosetting resin composition comprising epoxy acrylate and a photoinitiator so that the thickness of a film might be 1 μm, and prebaking was then carried out at 90° C. for 30 minutes to form a protective layer 6. Next, overall exposure was carried out to cure the protective layer 6, thereby preparing a color filter for liquid crystals.

The thus prepared color filter for liquid crystals was observed by an optical microscope, and as a result, defects such as color mixing, color unevenness and color skip were not confirmed.

A liquid crystal panel as shown in FIG. 3 was manufactured by the use of this color filter, and when a device using the panel was driven, a highly fine color display was possible.

EXAMPLE 3

A resin layer 3 obtained in Example 1 was roll-coated with a two-pack epoxy acrylate-based thermosetting resin composition so that the thickness of a film might be 1 μm, and prebaking was then carried out at 90° C. for 30 minutes to form a protective layer 6. Next, a heat treatment was carried out at 230° C. for 30 minutes to cure the protective layer 6, thereby preparing a color filter for liquid crystal display.

The thus prepared color filter for liquid crystal display was observed by an optical microscope, and as a result, defects such as color mixing, color unevenness and color skip were not confirmed.

A liquid crystal panel shown in FIG. 3 was manufactured by the use of this color filter, and when a device using the panel was driven, a highly fine color display was possible.

EXAMPLE 4

A resin layer 3 colored as in Example 1 was spin-coated with a photosetting resin composition comprising bisphenol A type epoxy resin and a photocationic initiator so that the thickness of a film might be 1 μm, and prebaking was then carried out at 90° C. for 30 minutes to form a protective layer 6. Next, overall exposure was carried out, followed by a heat treatment at 230° C. for 30 minutes to completely cure the protective layer 6, thereby preparing a color filter for liquid crystal display.

The thus prepared color filter for liquid crystal display was observed by an optical microscope, and as a result, defects such as color mixing, color unevenness and color skip were not confirmed.

A liquid crystal panel as shown in FIG. 3 was manufactured by the use of this color filter, and when a device using the panel was driven, a highly fine color display was possible.

EXAMPLE 5

On a resin layer 3 colored as in Example 1, an $SiO_2$ film 6 was formed by sputtering so that the thickness of a film might be 0.5 μm, to prepare a color filter for liquid crystal display.

The thus prepared color filter for liquid crystal display was observed by an optical microscope, and as a result, defects such as color mixing, color unevenness and color skip were not confirmed.

A liquid crystal panel as shown in FIG. 3 was manufactured by the use of this color filter, and when a device using the panel was driven, a highly fine color display was possible.

EXAMPLE 6

A glass substrate 1 on which black matrices 2 were formed was spin-coated with a photosetting resin composition comprising bisphenol A type epoxy resin and a photocationic initiator so that the thickness of a film might be 2 μm, and prebaking was then carried out at 90° C. for 20 minutes to form a photosetting resin composition layer 3.

Next, portions of the resin layer on the black matrices were pattern-exposed through a photomask provided with openings having a diameter smaller than the width of the black matrices, and a heat treatment was carried out at 120° C. for 10 minutes, thereby curing them. In addition, a matrix pattern of R, G and B was colored with pigment inks by the use of an ink jet head 5, and the inks were then dried at 90° C. for 5 minutes. In succession, overall exposure was carried out, followed by a heat treatment at 200° C. for 60 minutes to completely cure the resin layer 3.

EXAMPLE 7

A resin layer 3 colored as in Example 6 was spin-coated with a photosetting resin composition comprising epoxy acrylate and a photoinitiator so that the thickness of a film might be 1 μm, and prebaking was then carried out at 90° C. for 30 minutes to form a protective layer 6. Next, overall exposure was carried out to cure the protective layer 6, thereby preparing a color filter for liquid crystal display.

The thus prepared color filter for liquid crystal display was observed by an optical microscope, and as a result, defects such as color mixing, color unevenness and color skip were not confirmed.

A liquid crystal panel as shown in FIG. 3 was manufactured by the use of this color filter, and when a device using the panel was driven, a highly fine color display was possible.

EXAMPLE 8

A resin layer 3 colored as in Example 6 was spin-coated with a two-pack thermosetting resin composition so that the thickness of a film might be 1 µm, and prebaking was then carried out at 90° C. for 30 minutes to form a protective layer 6. Next, a heat treatment was carried out at 230° C. for 30 minutes to cure the protective layer 6, thereby preparing a color filter for liquid crystal display.

The thus prepared color filter for liquid crystal display was observed by an optical microscope, and as a result, defects such as color mixing, color unevenness and color skip were not confirmed.

A liquid crystal panel shown in FIG. 3 was manufactured by the use of this color filter, and when a device using the panel was driven, a highly fine color display was possible.

EXAMPLE 9

A resin layer 3 colored as in Example 6 was spin-coated with the same photosetting resin composition as used in Example 6 so that the thickness of a film might be 1 µm, and prebaking was then carried out at 90° C. for 30 minutes to form a protective layer 6. Next, overall exposure was carried out, followed by a heat treatment at 230° C. for 30 minutes to completely cure the protective layer 6, thereby preparing a color filter for liquid crystal display.

The thus prepared color filter for liquid crystal display was observed by an optical microscope, and as a result, defects such as color mixing, color unevenness and color skip were not confirmed.

A liquid crystal panel shown in FIG. 3 was manufactured by the use of this color filter, and when a device using the panel was driven, a highly fine color display was possible.

EXAMPLE 10

On a resin layer 3 colored as in Example 6, an $SiO_2$ film 6 was formed by sputtering so that the thickness of a film might be 0.5 µm, to prepare a color filter for liquid crystal display.

The thus prepared color filter for liquid crystal display was observed by an optical microscope, and as a result, defects such as color mixing, color unevenness and color skip were not confirmed.

A liquid crystal panel as shown in FIG. 3 was manufactured by the use of this color filter, and when a device using the panel was driven, a highly fine color display was possible.

EXAMPLE 11

A silicon substrate was spin-coated with a resin composition comprising

| | |
|---|---|
| hydroxypropyl cellulose (HPC-H, made by Nippon Soda Co., Ltd.) | 5 g |
| methylol melamine derivative (Sumitex M-3, made by Sumitomo Chemicals Inc.) | 5 g |
| cationic photoinitiator (SP-170, made by Adeca Co., Ltd.) | 0.25 g | and having an aqueous ink absorbency which would deteriorate in the light irradiation portions of the resin composition by light irradiation or the combination of the light irradiation and a heat treatment so that the thickness of a film might be 1 µm, and prebaking was then carried out at 90° C. for 20 minutes. Next, overall exposure was carried out in an exposure of 1 J/cm², and an infrared absorption spectrum was then measured in a reflective mode by the use of FT-IR (Micro FTIR-100, made by Nippon Bunko Kogyo Co., Ltd.). The thus measured infrared absorption spectrum was compared with a spectrum before the exposure to inspect the residue of a hydroxyl group. As a result, it was confirmed that the residue of the hydroxyl group was reduced to 70% of that of the hydroxyl group before the exposure.

Next, a glass substrate 1 on which black matrices were formed was spin-coated with the above-mentioned resin composition so as to make the thickness of a film of 2 µm, and prebaking was then carried out at 90° C. for 20 minutes.

Afterward, portions of the resulting resin layer were subjected to pattern exposure in an exposure of 1 J/cm² through a photomask provided with openings having a diameter smaller than the width of the black matrices to cure the portions of the resin layer. Furthermore, the unexposed portions of the resin layer were colored with dye inks by the use of an ink jet head 5 to obtain a matrix pattern of R, G and B, followed by drying the inks at 90° C. for 5 minutes. In succession, overall exposure was carried out.

Next, the resin layer was spin-coated with a two-pack thermosetting resin SS-7625 (made by JSR) as a protective layer so as to make the thickness of the layer of 1 µm, and a heat treatment was carried out at 230° C. for 1 hour to cure the protective layer.

The thus prepared color filter for liquid crystal display was observed by an optical microscope, and as a result, defects such as color mixing, color unevenness and color skip were not confirmed.

EXAMPLE 12

A silicon substrate was spin-coated with all the same resin composition as in Example 11 so that the thickness of a film might be 1 µm, and prebaking was then carried out at 90° C. for 20 minutes. Next, overall exposure was carried out in an exposure of 1 J/cm², followed by a heat treatment for 1 minute on a hot plate at 150° C. Afterward, the residue of a hydroxyl group was compared between before and after the exposure in the same manner as in Example 11, and as a result, it was confirmed that the residue of the hydroxyl group was reduced to 50% of that of the hydroxyl group before the exposure.

Next, a glass substrate on which black matrices were formed was spin-coated with the above-mentioned resin composition so as to make the thickness of a film of 2 µm, and prebaking was then carried out at 90° C. for 20 minutes to form a resin composition layer 3.

Afterward, portions of the resin layer were subjected to pattern exposure in an exposure of 1 J/cm² through a photomask provided with openings having a diameter smaller than the width of the black matrices, followed by a heat treatment at 150° C. for 1 minute on the hot plate. Furthermore, a matrix pattern of R, G and B was colored with dye inks by the use of an ink jet head 5, followed by drying the inks at 90° C. for 5 minutes. In succession, overall exposure and then a heat treatment at 200° C. for 1 hour were carried out to cure the resin layer.

Next, the resin layer was spin-coated with a two-pack thermosetting resin SS-7625 (made by JSR) as a protective layer so as to make the thickness of the layer of 1 µm, and a heat treatment was carried out at 230° C. for 1 hour to cure the protective layer.

The thus prepared color filter for liquid crystal display was observed by an optical microscope, and as a result, defects such as color mixing, color unevenness and color skip were not confirmed.

A liquid crystal panel as shown in FIG. 3 was manufactured by the use of this color filter, and when a device using the panel was driven, a highly fine color display was possible.

EXAMPLE 13

A glass substrate 1 on which black matrices were formed was spin-coated with all the same resin composition as in Example 11 so as to make the thickness of a film of 2 μm, and prebaking was then carried out at 90° C. for 20 minutes to form a resin composition layer.

Next, portions of the resin layer were subjected to pattern exposure in an exposure of 1 J/cm$^2$ through a photomask provided with openings having a diameter smaller than the width of the black matrices, followed by a heat treatment at 150° C. for 1 minute on a hot plate. Furthermore, a matrix pattern of R, G and B was colored with pigment inks by the use of an ink jet head 5, followed by drying the inks at 90° C. for 5 minutes. In succession, a heat treatment was carried out at 230° C. for 1 hour to cure the resin layer.

Afterward, the resin layer was spin-coated with a two-pack thermosetting resin SS-7625 (made by JSR) as a protective layer so as to make the thickness of the layer of 1 μm, and a heat treatment was carried out at 230° C. for 1 hour to cure the protective layer.

The thus prepared color filter for liquid crystal display was observed by an optical microscope, and as a result, defects such as color mixing, color unevenness and color skip were not confirmed.

EXAMPLE 14

By the use of a resin composition comprising

| | |
|---|---|
| hydroxyethyl cellulose<br>(AH-15, made by Fuji Chemical Co., Ltd.) | 5 g |
| methylol melamine derivative<br>(Sumitex M-3, made by Sumitomo Chemicals Inc.) | 5 g |
| 1-naphthyl-bis-trichloromethyl-S-triazine | 0.25 g | and having an aqueous ink absorbency which would deteriorate in the light irradiation portions of the resin composition by light irradiation or the combination of the light irradiation and a heat treatment, a sample was prepared and an infrared absorption spectrum was then measured, as in Example 11. The thus measured infrared absorption spectrum was compared with a spectrum before the exposure to inspect the residue of a hydroxyl group. As a result, it was confirmed that the residue of the hydroxyl group was reduced to 65% of that of the hydroxyl group before the exposure.

Next, a glass substrate 1 on which black matrices 2 were formed was spin-coated with the above-mentioned resin composition so as to make the thickness of a film of 2 μm, and prebaking was then carried out at 90° C. for 20 minutes.

Afterward, portions of the resulting resin layer were subjected to pattern exposure in an exposure of 1 J/cm$^2$ through a photomask provided with openings having a diameter smaller than the width of the black matrices to cure the portions of the resin layer 3. Furthermore, the unexposed portions of the resin layer were colored with dye inks by the use of an ink jet head 5 to obtain a matrix pattern of R, G and B, followed by drying the inks at 90° C. for 5 minutes. In succession, overall exposure was carried out to cure the resin layer.

Next, the resin layer was spin-coated with a two-pack thermosetting resin SS-7625 (made by JSR) as a protective layer 6 so as to make the thickness of the layer of 1 μm, and a heat treatment was carried out at 230° C. for 1 hour to cure the protective layer 6.

The thus prepared color filter for liquid crystal display was observed by an optical microscope, and as a result, defects such as color mixing, color unevenness and color skip were not confirmed.

EXAMPLE 15

The same resin composition as in Example 14 was used, and overall exposure and a heat treatment were then carried out in all the same manner as in Example 12. Furthermore, an infrared absorption spectrum was measured and then compared with a spectrum before the exposure to inspect the residue of a hydroxyl group. As a result, it was confirmed that the residue of the hydroxyl group was reduced to 48% of that of the hydroxyl group before the exposure.

Next, a glass substrate 1 on which black matrices 2 were formed was spin-coated with the above-mentioned resin composition so as to make the thickness of a film of 2 μm, and prebaking was then carried out at 90° C. for 20 minutes to form a resin composition layer 3.

Afterward, portions of the resin layer on the black matrices were subjected to pattern exposure in an exposure of 1 J/cm$^2$ through a photomask provided with openings having a diameter smaller than the width of the black matrices, followed by a heat treatment at 150° C. for 1 minute on a hot plate. Furthermore, a matrix pattern of R, G and B was colored with dye inks by the use of an ink jet head 5, followed by drying the inks at 90° C. for 5 minutes. In succession, overall exposure and then a heat treatment at 200° C. for 1 hour were carried out to cure the resin layer.

Next, the resin layer was spin-coated with a two-pack thermosetting resin SS-7625 (made by JSR) as a protective layer 6 so as to make the thickness of the layer of 1 μm, and a heat treatment was carried out at 230° C. for 1 hour to cure the protective layer 6.

The thus prepared color filter for liquid crystal display was observed by an optical microscope, and as a result, defects such as color mixing, color unevenness and color skip were not confirmed.

A liquid crystal panel as shown in FIG. 3 was manufactured by the use of this color filter, and when a device using the panel was driven, a highly fine color display was possible.

EXAMPLE 16

A glass substrate 1 on which black matrices 2 were formed was spin-coated with the same resin composition as in Example 14 so as to make the thickness of a film of 2 μm, and prebaking was then carried out at 90° C. for 20 minutes to form a resin composition layer 3.

Next, portions of the resin layer were subjected to pattern exposure in an exposure of 1 J/cm$^2$ through a photomask provided with openings having a diameter smaller than the width of the black matrices, followed by a heat treatment at 150° C. for 1 minute on a hot plate. Furthermore, a matrix pattern of R, G and B was colored with pigment inks by the use of an ink jet head 5, followed by drying the inks at 90° C. for 5 minutes. In succession, a heat treatment was carried out at 230° C. for 1 hour to cure the resin layer.

Afterward, the resin layer was spin-coated with a two-pack thermosetting resin SS-7625 (made by JSR) as a protective layer 6 so as to make the thickness of the layer of 1 μm, and a heat treatment was carried out at 230° C. for 1 hour to cure the protective layer 6.

The thus prepared color filter for liquid crystal display was observed by an optical microscope, and as a result, defects such as color mixing, color unevenness and color skip were not confirmed.

EXAMPLE 17

By the use of a resin composition comprising

| | |
|---|---|
| hydroxyethyl methacrylate-methyl methacrylate copolymer | 5 g |
| methylol melamine derivative (Sumitex M-3, made by Sumitomo Chemicals Inc.) | 5 g |
| cationic photoinitiator (SP-170, made by Adeca Co., Ltd.) | 0.25 g | and having an aqueous ink absorbency which would deteriorate in the light irradiation portions of the resin composition by light irradiation or the combination of the light irradiation and a heat treatment, a sample was prepared in all the same manner as in Example 11. Next, an infrared absorption spectrum was measured and then compared with a spectrum before the exposure to inspect the residue of a hydroxyl group. As a result, it was confirmed that the residue of the hydroxyl group was reduced to 40% of that of the hydroxyl group before the exposure.

Next, a color filter for liquid crystal display was prepared in all the same manner as in Example 11 and then observed by an optical microscope, and as a result, defects such as color mixing, color unevenness and color skip were not confirmed.

A liquid crystal panel as shown in FIG. 3 was manufactured by the use of this color filter, and when a device using the panel was driven, a highly fine color display was possible.

EXAMPLE 18

By the use of a resin composition comprising

| | |
|---|---|
| hydroxypropyl cellulose (HPC-H, made by Nippon Soda Co., Ltd.) | 5 g |
| dimethylolurea (T-251, made by Mitsui Toatsu Chemicals Inc.) | 5 g |
| cationic photoinitiator (SP-170, made by Adeca Co., Ltd.) | 0.25 g | and having an aqueous ink absorbency which would deteriorate in the light irradiation portions of the resin composition by light irradiation or the combination of the light irradiation and a heat treatment, a sample was prepared in all the same manner as in Example 11. Next, an infrared absorption spectrum was measured and then compared with a spectrum before the exposure to inspect the residue of a hydroxyl group. As a result, it was confirmed that the residue of the hydroxyl group was reduced to 60% of that of the hydroxyl group before the exposure.

Next, a color filter for liquid crystal display was prepared in all the same manner as in Example 11 and then observed by an optical microscope, and as a result, defects such as color mixing, color unevenness and color skip were not confirmed.

A liquid crystal panel as shown in FIG. 3 was manufactured by the use of this color filter, and when a device using the panel was driven, a highly fine color display was possible.

EXAMPLE 19

As shown in FIG. 2, a glass substrate 1 was coated with each composition of Examples 1, 6 and 11 to form a resin composition layer 3. Next, pattern exposure was carried out from the side of the resin layer 3 through a photomask 4 to lower the ink absorbency of the exposed portions of the resin. Furthermore, the exposed portions were colored with dye inks by the use of an ink jet head 5 to obtain a matrix pattern of R, G and B, and a heat treatment was then carried out under the same conditions as in each example.

Next, a protective layer 6 is formed in the same manner as in Example 2, thereby preparing a color filter for liquid crystal display.

The thus prepared color filter for liquid crystal display was observed by an optical microscope, and as a result, defects such as color mixing, color unevenness and color skip were not confirmed.

A liquid crystal panel as shown in FIG. 4 was manufactured by the use of this color filter, and when a device using the panel was driven, a highly fine color display was possible.

EXAMPLE 20

There was prepared a composition comprising (a) 10 parts by weight of a three-component copolymer of N-methylolacrylamide, methyl methacrylate and hydroxyethyl methacrylate and (b) 0.5 part by weight of a halogenated triazine compound (TAZ-101, made by Midori Chemical Co., Ltd.) having the formula

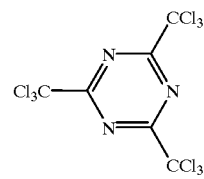

and having aqueous ink absorbency which would deteriorate in the light irradiation portions of the composition by light irradiation or the combination of the light irradiation and a heat treatment. Next, a glass substrate 1 on which black matrices 2 were formed was spin-coated with the composition, and prebaking was then carried out at 50° C. for 10 minutes to form a composition layer 3 having the ink absorbency which would deteriorate in the light irradiation portions of the composition by the light irradiation or the combination of the light irradiation and the heat treatment. At this time, the thickness of the layer 3 was 1 μm.

Next, the portions of the resin layer 3 on the black matrices 2 were subjected to pattern exposure through a photomask provided with openings having a diameter smaller than the width of the black matrices to deteriorate the ink absorbency of the exposed portions. Furthermore, a matrix pattern of R, G and B was colored with dye inks by the use of an ink jet head 5, followed by drying the inks at 90° C. for 5 minutes. In succession, a heat treatment was carried out at 230° C. for 1 hour to cure the resin layer, thereby preparing a color filter according to the present invention.

The thus prepared color filter for liquid crystal display was observed by an optical microscope, and as a result, defects such as color mixing, color unevenness and color skip were not confirmed.

EXAMPLES 21 TO 29

The same procedure as in Example 20 was carried out except that each composition shown in Table 1 was employed, to prepare a color filter according to the present invention. As a result, the same effect as in Example 20 could be confirmed.

TABLE 1

| Example | Component (a) | Component (b) |
|---|---|---|
| 21 | The same as in Example 20 | Halogenated triazine (TAZ-102)*1 |
| 22 | The same as in Example 20 | Halogenated triazine (TAZ-104)*2 |
| 23 | The same as in Example 20 | Halogenated triazine (TAZ-106)*3 |
| 24 | The same as in Example 20 | Halogenated triazine (TAZ-110)*4 |
| 25 | The same as in Example 20 | Halogenated triazine (TAZ-113)*5 |
| 26 | Two-component copolymer of N-methylolacrylamide and methyl methacrylate | The same as in Example 20 |
| 27 | Three-component copolymer of N-methylolacrylamide, styrene and hydroxyethyl acrylate | The same as in Example 20 |
| 28 | Four-component copolymer of N-methylolacrylamide, methyl methacrylate, acrylic acid and hydroxyethyl methacrylate | The same as in Example 20 |
| 29 | Three-component copolymer of N-methylolacrylamide, vinyl acetate and acrylic acid | The same as in Example 20 |

*1:

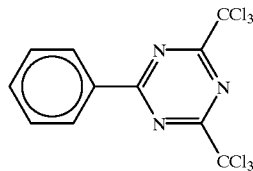

*2:

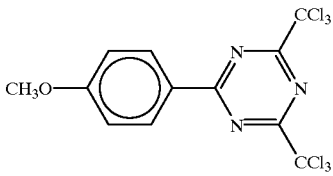

*3:

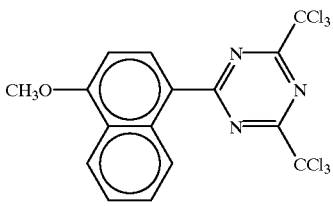

*4:

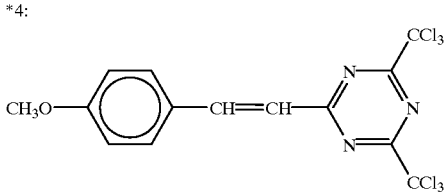

*5:

EXAMPLE 30

A colored layer 3 obtained in Example 20 was spin-coated with a two-pack thermosetting resin composition so that the thickness of a film might be 1 μm, and prebaking was then carried out at 90° C. for 30 minutes to form a second resin layer 6. Next, a heat treatment was carried out at 230° C. for 30 minutes to cure the second resin layer, thereby preparing a color filter for liquid crystal display.

The thus prepared color filter for liquid crystal display was observed by an optical microscope, and as a result, defects such as color mixing, color unevenness and color skip were not confirmed.

In addition, a liquid crystal panel shown in FIG. 3 was manufactured by the use of this color filter, and when a device using the panel was driven, a highly fine color display was possible.

EXAMPLE 31

There was prepared a composition comprising
(a) 10 parts by weight of a three-dimensional copolymer of N-methylolacrylamide, methyl methacrylate and hydroxyethyl methacrylate, and
(b) 0.2 part by weight of triphenylsulfonium triflate (TPS-105, made by Midori Chemical Co., Ltd.) and having aqueous ink absorbency which would deteriorate in the light irradiation portions of the composition by light irradiation or the combination of the light irradiation and a heat treatment. Next, a glass substrate 1 on which black matrices 2 were formed was spin-coated with the composition, and prebaking was then carried out at 60° C. for 10 minutes to form a composition layer 3 having the ink absorbency which would deteriorate in the light irradiation portions of the composition by the light irradiation or the combination of the light irradiation and the heat treatment. At this time, the thickness of the layer was 1 μm.

Next, portions of the resin layer on the black matrices were subjected to pattern exposure through a photomask provided with openings having a diameter smaller than the width of the black matrices to deteriorate the ink absorbency of the exposed portions. Furthermore, a matrix pattern of R, G and B was colored with dye inks by the use of an ink jet head 5, followed by drying the inks at 90° C. for 5 minutes. In succession, a heat treatment was carried out at 230° C. for 1 hour to cure the colored resin layer, thereby preparing a color filter according to the present invention.

The thus prepared color filter for liquid crystal display was observed by an optical microscope, and as a result, defects such as color mixing, color unevenness and color skip were not confirmed.

EXAMPLES 32 TO 40

The same procedure as in Example 31 was carried out except that each composition shown in Table 2 was employed, to prepare a color filter. As a result, the same effect as in Example 31 could be confirmed.

TABLE 2

| Example | Component (a) | Component (b) |
|---------|---------------|---------------|
| 32 | The same as in Example 31 | Triphenylsulfonium hexafluoroantimonate (TPS-103) |
| 33 | The same as in Example 31 | Triphenylsulfonium hexafluorophosphate (TPS-102) |
| 34 | The same as in Example 31 | Triphenylsulfonium tetrafluoroborate (TPS-101) |
| 35 | The same as in Example 31 | Compound having the following structure (MDS-105)*6 |
| 36 | The same as in Example 31 | Compound having the following structure (DTS-102)*7 |
| 37 | The same as in Example 26 | The same as in Example 31 |
| 38 | The same as in Example 27 | The same as in Example 31 |
| 39 | The same as in Example 28 | The same as in Example 31 |
| 40 | The same as in Example 29 | The same as in Example 31 |

*6:

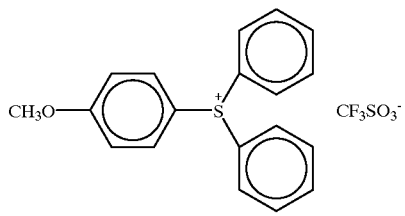

*7:

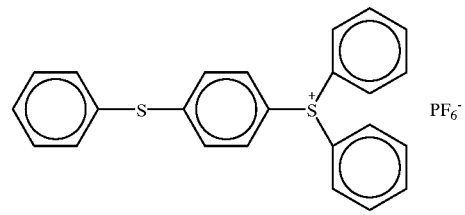

EXAMPLE 41

A colored layer 3 obtained in Example 31 was spin-coated with a two-pack thermosetting resin composition so that the thickness of a film might be 1 μm, and prebaking was then carried out at 90° C. for 30 minutes to form a second resin layer 6. Next, a heat treatment was carried out at 230° C. for 30 minutes to cure the second resin layer, thereby preparing a color filter for liquid crystal display.

The thus prepared color filter for liquid crystal display was observed by an optical microscope, and as a result, defects such as color mixing, color unevenness and color skip were not confirmed.

In addition, a liquid crystal panel shown in FIG. 3 was manufactured by the use of this color filter, and when a device using the panel was driven, a highly fine color display was possible.

EXAMPLE 42

There was prepared a composition comprising
(a) 10 parts by weight of a three-component copolymer of N-methylolacrylamide, methyl methacrylate and hydroxyethyl methacrylate, and (b) 0.2 part by weight of diphenyliodonium triflate (DPI-105, made by Midori Chemical Co., Ltd.) and having aqueous ink absorbency which would deteriorate in the light irradiation portions of the composition by light irradiation or the combination of the light irradiation and a heat treatment. Next, a glass substrate 1 on which black matrices 2 were formed was spin-coated with the composition, and prebaking was then carried out at 50° C. for 10 minutes to form a composition layer 3 having the ink absorbency which would deteriorate in the light irradiation portions of the composition by the light irradiation or the combination of the light irradiation and the heat treatment. At this time, the thickness of the layer was 1 μm.

Next, portions of the resin layer on the black matrices were subjected to pattern exposure through a photomask provided with openings having a diameter smaller than the width of the black matrices to deteriorate the ink absorbency of the exposed portions. Furthermore, a matrix pattern of R, G and B was colored with dye inks by the use of an ink jet head 5, followed by drying the inks at 90° C. for 5 minutes. In succession, a heat treatment was carried out at 230° C. for 1 hour to cure the colored resin layer, thereby preparing a color filter according to the present invention.

The thus prepared color filter for liquid crystal display was observed by an optical microscope, and as a result, defects such as color mixing, color unevenness and color skip were not confirmed.

EXAMPLES 43 TO 51

The same procedure as in Example 42 was carried out except that each composition shown in Table 3 was employed, to prepare a color filter. As a result, the same effect as in Example 42 could be confirmed.

TABLE 3

| Example | Component (a) | Component (b) |
|---------|---------------|---------------|
| 43 | The same as in Example 42 | Diphenyliodonium hexafluoroantimonate (DPI-103) |
| 44 | The same as in Example 42 | Diphenyliodonium hexafluorophosphate (DPI-102) |
| 45 | The same as in Example 42 | Diphenyliodonium tetrafluoroborate (DPI-101) |
| 46 | The same as in Example 42 | Compound having the following structure (MPI-105)*8 |
| 47 | The same as in Example 42 | Compound having the following structure (BBI-105)*9 |
| 48 | The same as in Example 26 | The same as in Example 42 |
| 49 | The same as in Example 27 | The same as in Example 42 |
| 50 | The same as in Example 28 | The same as in Example 42 |
| 51 | The same as in Example 29 | The same as in Example 42 |

*8:

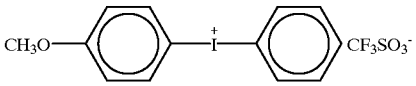

*9:

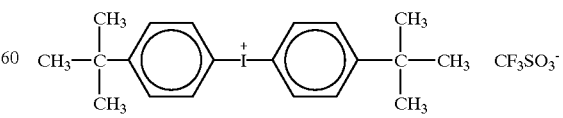

EXAMPLE 52

A colored layer 3 obtained in Example 42 was spin-coated with a two-pack thermosetting resin composition so as to make the thickness of a film of 1 µm, and prebaking was then carried out at 90° C. for 30 minutes to form a second resin layer 6. Next, a heat treatment was carried out at 230° C. for 30 minutes to cure the second resin layer, thereby preparing a color filter for liquid crystal display.

The thus prepared color filter for liquid crystal display was observed by an optical microscope, and as a result, defects such as color mixing, color unevenness and color skip were not confirmed.

In addition, a liquid crystal panel shown in FIG. 3 was manufactured by the use of this color filter, and when a device using the panel was driven, a highly fine color display was possible.

EXAMPLE 53

5 g of polyparahydroxystyrene having a hydroxyl group protected with a trimethylsilyl group and 0.5 g of a cationic photoinitiator (SP-170, made by Adeca Co., Ltd.) were dissolved in 250 g of ethyl cellosolve acetate to prepare a resin composition which could be used in the present invention.

A glass substrate 1 was spin-coated with the above-mentioned resin composition so as to make the thickness of a film of 1 µm, and prebaking was then carried out at 100° C. for 15 minutes. Next, overall exposure was done in an exposure of 1.5 J/cm$^2$, and an infrared absorption spectrum was then measured in a reflective mode by the use of FT-IR (Micro FTIR-100, made by Nippon Bunko Kogyo Co., Ltd.). The thus measured infrared absorption spectrum was compared with a spectrum before the exposure to inspect the residue of a hydroxyl group. As a result, it was confirmed that the residue of the hydroxyl group was increased to 700% of that of the hydroxyl group before the exposure.

Next, a glass substrate 1 on which black matrices 2 were formed was spin-coated with the above-mentioned resin composition so as to make the thickness of a film of 2 µm, and prebaking was then carried out at 100° C. for 15 minutes.

Afterward, portions of the resulting resin layer on light-transmittable portions (which partially contained the resin on the black matrices) were subjected to pattern exposure in an exposure of 1.5 J/cm$^2$ through a photomask provided with openings having a diameter larger than the width of the light-transmittable portions to render the resin layer ink-acceptable.

Furthermore, the ink-acceptable portions of the resin layer were colored with dye inks having a pH 9 by the use of an ink jet head 5 to obtain a matrix pattern of R, G and B, followed by drying the inks at 90° C. for 5 minutes. In succession, a heat treatment was carried out at 200° C. for 60 minutes to cure the resin layer 3.

Next, the resin layer 3 was spin-coated with a two-pack thermosetting resin SS-7625 (made by JSR) as a protective layer 6 so as to make the thickness of the layer of 1 µm, and a heat treatment was carried out at 230° C. for 1 hour to cure a protective layer 6.

The thus prepared color filter for liquid crystal display was observed by an optical microscope, and as a result, defects such as color mixing, color unevenness and color skip were not confirmed.

A liquid crystal panel shown in FIG. 3 was manufactured by the use of this color filter, and when a device using the panel was driven, a highly fine color display was possible.

EXAMPLE 54

A silicon substrate was spin-coated with a resin composition prepared in Example 53 so as to make the thickness of a layer of 1 µm, and prebaking was then carried out at 100° C. for 15 minutes. Next, overall exposure was done in an exposure of 1.5 J/cm$^2$, and followed by a heat treatment for 1 minute on a hot plate at 150° C. Afterward, the residue of a hydroxyl group was compared between before and after the exposure in the same manner as in Example 53, and as a result, it was confirmed that the residue of the hydroxyl group was increased to 500% of that of the hydroxyl group before the exposure.

Next, a glass substrate 1 on which black matrices 2 were formed was spin-coated with the above-mentioned resin composition so as to make the thickness of a layer of 2 µm, and prebaking was then carried out at 100° C. for 15 minutes to form a resin layer 3.

Afterward, the portions of the resulting resin layer on light-transmittable portions (partially containing the resin on the black matrices) were subjected to pattern exposure in an exposure of 1.5 J/cm$^2$ through a photomask provided with openings having a diameter larger than the width of the light-transmittable portions, followed by a heat treatment for 1 minute on a hot plate at 150° C., thereby rendering the resin layer ink-acceptable.

Furthermore, the ink-acceptable portions of the resin layer were colored with dye inks having a pH 9.5 by the use of an ink jet head 5 to obtain a matrix pattern of R, G and B, followed by drying the inks at 90° C. for 5 minutes. In succession, a heat treatment was carried out at 200° C. for 1 hour to cure the resin layer 3, and a protective layer 6 was further formed on the resin layer 3 in the same manner as in Example 53.

The thus prepared color filter for liquid crystal display was observed by an optical microscope, and as a result, defects such as color mixing, color unevenness and color skip were not confirmed.

A liquid crystal panel shown in FIG. 3 was manufactured by the use of this color filter, and when a device using the panel was driven, contrast is high and a highly fine color display was possible.

EXAMPLE 55

The same procedure as in Example 54 was effected except that exposure was done from the side of a substrate 1 by the utilization of black matrices as a photomask, as shown in FIGS. 5A to 5E, thereby preparing a color filter.

The thus prepared color filter for liquid crystal display was observed by an optical microscope, and as a result, defects such as color mixing, color unevenness and color skip were not confirmed.

A liquid crystal panel shown in FIG. 3 was manufactured by the use of this color filter, and when a device using the panel was driven, a highly fine color display was possible.

EXAMPLE 56

5 g of cellulose triacetate and 0.7 g of 1-naphthyl-bis-trichloromethyl-s-triazine were dissolved in 250 g of chloroform to prepare a resin composition which could be used in the present invention.

Afterward, the residue of a hydroxyl group was compared between before and after the exposure in the same manner as in Example 53, and as a result, it was confirmed that the residue of the hydroxyl group after the exposure was increased to 500% of that of the hydroxyl group before the exposure.

Next, a glass substrate 1 on which black matrices 2 were formed was roll-coated with the above-mentioned resin composition so as to make the thickness of a layer of 2 μm, and prebaking was then carried out at 90° C. for 20 minutes to form a resin layer 3.

Afterward, the portions of the resulting resin layer on light-transmittable portions (partially containing the resin on the black matrices) were subjected to pattern exposure in an exposure of 1 J/cm² through a photomask provided with openings having a diameter larger than the width of the light-transmittable portions, followed by rendering the resin layer ink-acceptable.

Furthermore, the ink-acceptable portions of the resin layer were colored with dye inks having a pH 8.5 by the use of an ink jet head 5 to obtain a matrix pattern of R, G and B, followed by drying the inks at 90° C. for 5 minutes. In succession, a heat treatment was carried out at 200° C. for 60 minutes to cure the resin layer 3.

A protective layer 6 was further formed on the resin layer 3 in the same manner as in Example 53.

The thus prepared color filter for liquid crystal display was observed by an optical microscope, and as a result, defects such as color mixing, color unevenness and color skip were not confirmed.

A liquid crystal panel shown in FIG. 3 was manufactured by the use of this color filter, and when a device using the panel was driven, a highly fine color display was possible.

EXAMPLE 57

For a resin composition prepared in Example 56, the amount of a hydroxyl group was compared between before and after the exposure in the same manner as in Example 54, and as a result, it was confirmed that the amount of the hydroxyl group after the exposure was increased to 600% of that of the hydroxyl group before the exposure.

Next, a glass substrate 1 on which black matrices 2 were formed was roll-coated with the above-mentioned resin composition so as to make the thickness of a layer of 2 μm, and prebaking was then carried out at 90° C. for 20 minutes to form a resin layer 3.

Afterward, the portions of the resulting resin layer on light-transmittable portions (partially containing the resin on the black matrices) were subjected to pattern exposure in an exposure of 1 J/cm² through a photomask provided with openings having a diameter larger than the width of the light-transmittable portions, followed by prebaking at 150° C. for 1 minute on a hot plate, thereby rendering the resin layer ink-acceptable.

Furthermore, the ink-acceptable portions of the resin layer were colored with dye inks having a pH 9.3 by the use of an ink jet head 5 to obtain a matrix pattern of R, G and B, followed by drying the inks at 90° C. for 5 minutes. In succession, overall exposure was done, and a heat treatment was then carried out at 200° C. for 60 minutes to cure the resin layer 3.

A protective layer 6 was further formed on the resin layer 3 in the same manner as in Example 54.

The thus prepared color filter for liquid crystal display was observed by an optical microscope, and as a result, defects such as color mixing, color unevenness and color skip were not confirmed.

A liquid crystal panel shown in FIG. 3 was manufactured by the use of this color filter, and when a device using the panel was driven, a highly fine color display was possible.

EXAMPLE 58

The same procedure as in Example 57 was effected except that exposure was done from the side of a substrate 1 by the utilization of black matrices as a photomask, as shown in FIGS. 5A to 5E, thereby preparing a color filter.

The thus prepared color filter for liquid crystal display was observed by an optical microscope, and as a result, defects such as color mixing, color unevenness and color skip were not confirmed.

EXAMPLE 59

The same procedure as in Example 57 was effected except that a pigment ink having a pH 9.1 was used as an ink, thereby preparing a color filter.

The thus prepared color filter for liquid crystal display was observed by an optical microscope, and as a result, defects such as color mixing, color unevenness and color skip were not confirmed.

A liquid crystal panel shown in FIG. 3 was manufactured by the use of this color filter, and when a device using the panel was driven, a highly fine color display was possible.

EXAMPLE 60

A glass substrate 1 on which black matrices 2 were formed was spin-coated with a resin composition comprising (a) 10 parts by weight of polyphenoxyethyl methacrylate (molecular weight=12000) and (b) 0.5 part by weight of a halogenated triazine compound (trade name TAZ-110, made by Midori Chemical Co., Ltd.) having the structure

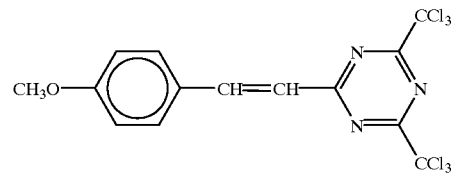

so as to make the thickness of a layer of 2 μm, as shown in FIG. 5, and prebaking was then carried out at 90° C. for 20 minutes to form a resin layer 3.

In succession, overall pattern exposure was done from the side of the substrate 1 so that the portions of the resin composition on the black matrices 2 might also be irradiated with light, and a heat treatment was then carried out at 110° C. for 60 seconds. Afterward, openings of the resin composition layer 3 were colored with dye inks by the use of an ink jet head 5 to obtain a matrix pattern of R, G and B, followed by a heat treatment at 90° C. for 5 minutes and at 200° C. for 30 minutes.

Next, the resin layer 3 was spin-coated with a two-pack thermosetting resin (trade name Optomer SS-6688, made by Japan Synthetic Rubber Co., Ltd.) as a protective layer 6 so as to make the thickness of the layer of 1 μm, and prebaking was then carried out at 90° C. for 30 minutes to form a second resin layer 6, followed by a heat treatment at 230° C. for 30 minutes to cure the second resin layer, thereby preparing a color filter for liquid crystal display.

The thus prepared color filter for liquid crystal display was observed by an optical microscope, and as a result, defects such as color mixing, color unevenness and color skip were not confirmed.

A liquid crystal panel shown in FIG. 3 was manufactured by the use of this color filter, and when a device using the panel was driven, a highly fine color display was possible.

EXAMPLES 61 TO 63

The same procedure as in Example 60 was carried out except that each composition shown in Table 4 was employed, to prepare a color filter. As a result, the same effect as in Example 60 could be confirmed.

TABLE 4

| Example | Component (a) | Component (b) |
|---------|---------------|---------------|
| 61 | Phenoxyethyl methacrylate-methyl methacrylate copolymer (molecular weight = 18000) | Halogenated triazine (trade name TAZ-105*10, made by Midori Chemical Co., Ltd.) |
| 62 | Phenoxyethyl methacrylate-methyl methacrylate-hydroxyethyl methacrylate copolymer (molecular weight = 12000) | Halogenated triazine (trade name TAZ-101*11, made by Midori Chemical Co., Ltd.) |
| 63 | Phenoxyethyl methacrylate (molecular weight = 52000) | The same as in Example 60 |

*10:

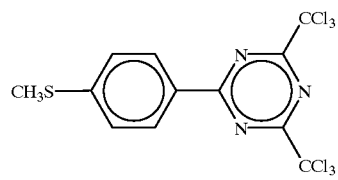

*11:

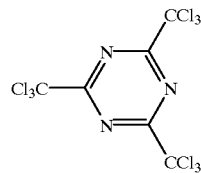

EXAMPLE 64

A glass substrate 1 on which black matrices 2 were formed was spin-coated with a resin composition comprising (a) 10 parts by weight of polyphenoxyethyl methacrylate (molecular weight=12000) and (b) 0.2 part by weight of a diphenyliodonium salt (trade name DPI-105, made by Midori Chemical Co., Ltd.) having the formula

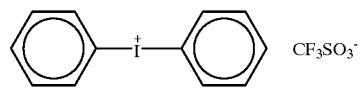

so as to make the thickness of a layer of 2 μm, as shown in FIG. 5, and prebaking was then carried out at 90° C. for 20 minutes to form a resin layer 3.

Next, overall pattern exposure was done from the side of the substrate 1 so that the portions of the resin composition on the black matrices 2 might also be irradiated with light, and a heat treatment was then carried out at 110° C. for 60 seconds. Afterward, openings of the resin composition layer were colored with dye inks by the use of an ink jet head 5 to obtain a matrix pattern of R, G and B, followed by a heat treatment at 90° C. for 5 minutes and at 200° C. for 30 minutes.

Moreover, a protective layer 6 was formed in the same manner as in Example 60, thereby preparing a color filter for liquid crystal display.

The thus prepared color filter for liquid crystal display was observed by an optical microscope, and as a result, defects such as color mixing, color unevenness and color skip were not confirmed. A liquid crystal panel shown in FIG. 3 was manufactured by the use of this color filter, and when a device using the panel was driven, a highly fine color display was possible.

EXAMPLES 65 TO 67

The same procedure as in Example 64 was carried out except that each composition shown in Table 5 was employed, to prepare a color filter. As a result, the same effect as in Example 64 could be confirmed.

TABLE 5

| Example | Component (a) | Component (b) |
|---------|---------------|---------------|
| 65 | Phenoxyethyl methacrylate-methyl methacrylate copolymer (molecular weight = 18000) | Diphenyliodonium salt derivative (trade name TAZ-105, made by Midori Chemical Co., Ltd.)*12 |
| 66 | Phenoxyethyl methacrylate-methyl methacrylate-hydroxyethyl methacrylate copolymer (molecular weight = 12000) | Diphenyliodonium salt derivative (trade name BBI-105, made by Midori Chemical Co., Ltd.)*13 |
| 67 | Phenoxyethyl methacrylate (molecular weight = 52000) | The same as in Example 64 |

*12:

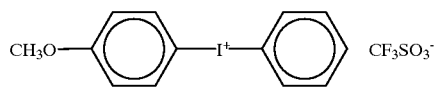

*13:

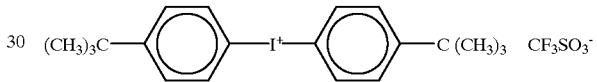

EXAMPLE 68

A glass substrate 1 on which black matrices 2 were formed was spin-coated with a resin composition comprising (a) 10 parts by weight of polyphenoxyethyl methacrylate (molecular weight=12000) and (b) 0.2 part by weight of a triphenylsulfonium salt (trade name TPS-105, made by Midori Chemical Co., Ltd.) having the formula

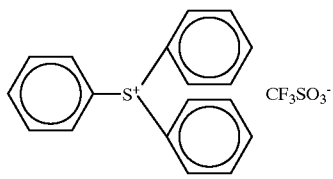

so as to makethe thickness of a layer of 2 μm, as shown in FIG. 5, and prebaking was then carried out at 90° C. for 20 minutes to form a resin layer 3.

Next, overall pattern exposure was done from the side of the substrate 1 so that the portions of the resin composition on the black matrices 2 might also be irradiated with light, and a heat treatment was then carried out at 110° C. for 60 seconds. Afterward, openings of the resin composition layer were colored with dye inks by the use of an ink jet head 5 to obtain a matrix pattern of R, G and B, followed by a heat treatment at 90° C. for 5 minutes and at 200° C. for 30 minutes.

Moreover, a protective layer 6 was formed in the same manner as in Example 60 to prepare a color filter for liquid crystal display.

The thus prepared color filter for liquid crystal display was observed by an optical microscope, and as a result, defects such as color mixing, color unevenness and color skip were not confirmed.

A liquid crystal panel shown in FIG. 3 was manufactured by the use of this color filter, and when a device using the panel was driven, a highly fine color display was possible.

EXAMPLES 69 TO 71

The same procedure as in Example 68 was carried out except that each composition shown in Table 6 was employed, to prepare a color filter. As a result, the same effect as in Example 68 could be confirmed.

TABLE 6

| Example | Component (a) | Component (b) |
|---|---|---|
| 69 | Phenoxyethyl methacrylate-methyl methacrylate copolymer (molecular weight = 18000) | Triphenylsulfonium salt derivative (trade name MDS-105, made by Midori Chemical Co., Ltd.)*14 |
| 70 | Phenoxyethyl methacrylate-methyl methacrylate-hydroxyethyl methacrylate copolymer (molecular weight = 12000) | Triphenylsulfonium salt derivative (trade name MDS-205, made by Midori Chemical Co., Ltd.)*15 |
| 71 | Phenoxyethyl methacrylate (molecular weight = 52000) | The same as in Example 68 |

*14:

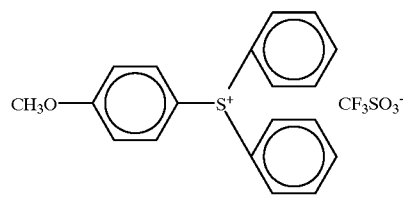

*15:

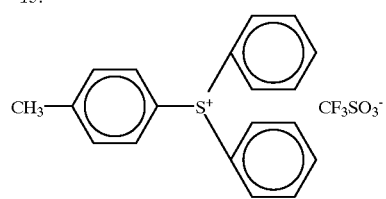

EXAMPLE 72

A glass substrate 1 was coated with a composition in Example 60, as shown in FIG. 6, thereby forming a resin composition layer 3. Next, pattern exposure was carried out from the side of the resin layer 3 through a photomask 4 to improve the ink absorbency of the exposed portions of the resin. Afterward, the exposed portions were colored with dye inks by the use of an ink jet head 5 to obtain a matrix pattern of R, G and B, followed by a heat treatment at 90° C. for 5 minutes and at 200° C. for 30 minutes.

Moreover, a protective layer 6 was formed in the same manner as in Example 60 to prepare a color filter for liquid crystal display.

The thus prepared color filter for liquid crystal display was observed by an optical microscope, and as a result, defects such as color mixing, color unevenness and color skip were not confirmed.

A liquid crystal panel shown in FIG. 4 was manufactured by the use of this color filter, and when a device using the panel was driven, a highly fine color display was possible.

EXAMPLE 73

A glass substrate 1 was coated with a composition in Example 64, as shown in FIG. 6, thereby forming a resin composition layer 3. Next, pattern exposure was carried out from the side of the resin layer 3 through a photomask 4 to improve the ink absorbency of the exposed portions of the resin. Afterward, the exposed portions were colored with dye inks by the use of an ink jet head 5 to obtain a matrix pattern of R, G and B, followed by a heat treatment at 90° C. for 5 minutes and at 200° C. for 30 minutes.

Moreover, a protective layer 6 was formed in the same manner as in Example 60 to prepare a color filter for liquid crystal display.

The thus prepared color filter for liquid crystal display was observed by an optical microscope, and as a result, defects such as color mixing, color unevenness and color skip were not confirmed.

A liquid crystal panel shown in FIG. 4 was manufactured by the use of this color filter, and when a device using the panel was driven, a highly fine color display was possible.

EXAMPLE 74

A glass substrate 1 was coated with a composition in Example 68, as shown in FIG. 6, thereby forming a resin composition layer 3. Next, pattern exposure was carried out from the side of the resin layer 3 through a photomask 4 to improve the ink absorbency of the exposed portions of the resin. Afterward, the exposed portions were colored with dye inks by the use of an ink jet head 5 to obtain a matrix pattern of R, G and B, followed by a heat treatment at 90° C. for 5 minutes and at 200° C. for 30 minutes.

Moreover, a protective layer 6 was formed in the same manner as in Example 60 to prepare a color filter for liquid crystal display.

The thus prepared color filter for liquid crystal display was observed by an optical microscope, and as a result, defects such as color mixing, color unevenness and color skip were not confirmed.

A liquid crystal panel shown in FIG. 4 was manufactured by the use of this color filter, and when a device using the panel was driven, a highly fine color display was possible.

According to the present invention, there can be provided a highly reliable color filter for liquid crystal display which is free from defects such as color mixing, color unevenness and color skip, and a liquid crystal panel which permits a highly fine color display.

While the present invention has been described with respect to what is presently considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded to the broadest interpretation so as to encompass all such modifications and equivalent structures and functions.

What is claimed is:

1. A color filter comprising:
   a substrate having shade portions; and
   a cured continuous resin layer on the substrate and the shade portions, wherein the resin layer provides (i) a plurality of different colored portions colored by an ink-jet system and (ii) color skip preventing portions provided on the shade portions, the width of the color skip preventing portions being smaller than that of the shade portions,
   wherein said resin layer is cured after coloration, and the plural colored portions and the color skip preventing portions are contained in the cured resin layer.

2. A color filter comprising:

a substrate having shade portions; and a cured continuous resin layer on the substrate which provides a plurality of colored portions of different colors and color skip preventing portions, said color skip preventing portions being provided on the shade portions and having a width smaller than that of the shade portions, and a protect layer on the cured resin layer, wherein said colored portions are colored by an ink jet system and said resin layer is cured after coloration, and the plural colored portions and the color skip preventing portions are contained in the cured resin layer.

3. The color filter according to claim 1 or 2, wherein the substrate is light-transmittable.

4. The color filter according to claim 1 or 2, wherein the resin which is contained in the colored portions and the color skip preventing portions is made of one material.

5. The color filter according to claim 1 or 2, wherein the colored portions are in contact with the shade portions.

6. A liquid crystal panel which comprises a color filter described in any one of claims 1 or 2, a substrate opposite to the color filter, and a liquid crystal compound enclosed between both the substrates.

7. A color filter according to claim 1 or 2, said resin comprising at least (a) a homopolymer of a monomer comprising a structure unit represented by the following formula (I) and/or a copolymer of the above-mentioned monomer and another vinyl monomer, and (b) a compound selected from the group consisting of halogenated triazine compounds, diphenyliodonium salt derivatives and triphenylsulfonium salt derivatives:

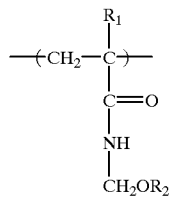

(I)

wherein $R_1$ is hydrogen or a methyl group; and $R_2$ is a hydrogen atom or an alkyl group having 1 to 5 carbon atoms.

8. The color filter according to claim 7, wherein the amount of the compound (b) is in the range of from 0.01 to 10 parts by weight with respect to 100 parts by weight of the homopolymer or the copolymer (a).

9. A liquid crystal panel which comprises a color filter described in claim 7, a substrate arranged at a position facing to the color filter, and a liquid crystal composition sealed between the color filter and the substrate.

10. A color filter according to claim 1 or 2, said resin comprising at least (a) an acrylic resin having a structure unit represented by the following formula (V) and (b) a compound selected from the group consisting of halogenated triazine compounds, diphenyliodonium salt derivatives and triphenylsulfonium salt derivatives:

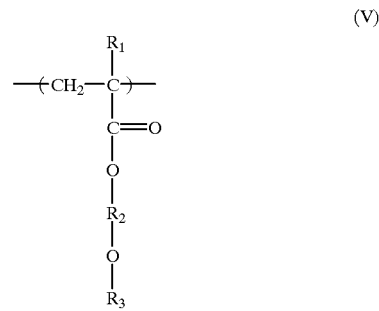

(V)

wherein $R_1$ is hydrogen or an alkyl group having 1 to 5 carbon atoms; $R_2$ is an alkylene group having 1 to 5 carbon atoms or a phenylene group; $R_3$ is an alkyl group having 1 to 5 carbon atoms, an alkyl-substituted silyl group, a phenyl group or a substituted aromatic group.

11. The color filter according to claim 10, wherein the amount of the compound (b) is in the range of from 0.01 to 10 parts by weight with respect to 100 parts by weight of the acrylic resin (a).

12. A liquid crystal panel which comprises a color filter described in claim 10, a substrate arranged at a position opposite to the color filter, and a liquid crystal composition enclosed between the color filter and the substrate.

* * * * *

UNITED STATES PATENT AND TRADEMARK OFFICE
CERTIFICATE OF CORRECTION

PATENT NO.    : 6,180,294 B1
DATED         : January 30, 2001
INVENTOR(S)   : Shoji Shiba et al.

It is certified that error appears in the above-identified patent and that said Letters Patent is hereby corrected as shown below:

<u>Title page,</u>
Insert Item -- [*] Notice:     This patent issued on a continued prosecution application filed under 37 CFR 1.53(d), and is subject to the twenty year patent term provisions of 35 U.S.C. 154(a)(2). --; and
Item [56], References Cited, FOREIGN PATENT DOCUMENTS:
"61-077014  4/1986  (JP)" should be deleted;
"04349401" should read -- 4-349401 --;
"01217320" should read -- 1-217320 --;
"02173703" should read -- 2-173703 --;
"02228605" should read -- 2-228605 --;
"05288913" should read -- 5-288913 --;
"06228440" should read -- 6-228440 --;
"05173010" should read -- 5-173010 --; and
"04317007" should read -- 4-317007 --.

<u>Column 2,</u>
Line 25, "law" should read -- low --; and
Line 66, "to" should be deleted.

<u>Column 3,</u>
Line 3, "shape" should read -- shaped --.

<u>Column 5,</u>
Line 65, "to" should be deleted.

<u>Column 7,</u>
Line 67, "is" should read -- be --.

<u>Column 9,</u>
Line 1, "an" should read -- a --;
Line 4, "deteriorate" should read -- deteriorates --; and
Line 57, "methacylic" should read -- methacrylic.

<u>Column 11,</u>
Line 50, "hexafluorophosate" should read -- hexafluorophosphate --; and
Line 65, "(FIG.1D)," should read -- (FIG. 1C), --.

UNITED STATES PATENT AND TRADEMARK OFFICE
CERTIFICATE OF CORRECTION

PATENT NO. : 6,180,294 B1
DATED : January 30, 2001
INVENTOR(S) : Shoji Shiba et al.

It is certified that error appears in the above-identified patent and that said Letters Patent is hereby corrected as shown below:

Column 12,
Line 1, "(FIG. 1C)." should read -- (FIG. 1D). --; and
Line 3, "an" should read -- a --.

Column 13,
Line 38, "is" should read -- be --.

Column 15,
Lines 2, 18, 34 and 50, "Exemplarly" should read -- Exemplary --.

Column 16,
Lines 2 and 18, "Exemplarly" should read -- Exemplary --; and
Line 37, "of" should read -- in --.

Column 30,
Line 38, "is" should read -- was --.

Column 34,
Line 51, "makethe" should read -- make the --.

Column 38,
Line 9, "to" should be deleted.

Signed and Sealed this

Eighteenth Day of February, 2003

JAMES E. ROGAN
*Director of the United States Patent and Trademark Office*